United States Patent
Shields et al.

(10) Patent No.: US 7,019,333 B1
(45) Date of Patent: Mar. 28, 2006

(54) PHOTON SOURCE

(75) Inventors: Andrew J. Shields, Cambridge (GB); Richard A. Hogg, Cambridge (GB)

(73) Assignee: Kabushiki Kaisha Toshiba, Kawasaki (JP)

( * ) Notice: Subject to any disclaimer, the term of this patent is extended or adjusted under 35 U.S.C. 154(b) by 616 days.

(21) Appl. No.: 09/713,242

(22) Filed: Nov. 16, 2000

(30) Foreign Application Priority Data

Nov. 16, 1999 (GB) .................................... 9927107
Nov. 23, 1999 (GB) .................................... 9927690

(51) Int. Cl.
*H01L 29/225* (2006.01)
*H01L 5/00* (2006.01)

(52) U.S. Cl. ............................ 257/97; 257/13; 257/17; 372/43

(58) Field of Classification Search .......... 372/43–50, 372/70; 257/13, 14, 97
See application file for complete search history.

(56) References Cited

U.S. PATENT DOCUMENTS

| | | | |
|---|---|---|---|
| 5,314,838 A * | 5/1994 | Cho et al. ....................... | 438/32 |
| 5,423,798 A * | 6/1995 | Crow ............................. | 606/4 |
| 5,559,822 A | 9/1996 | Pankove et al. | |
| 5,607,876 A | 3/1997 | Biegelsen et al. | |
| 5,646,418 A * | 7/1997 | Frazier et al. .................. | 257/4 |
| 5,953,356 A * | 9/1999 | Botez et al. .................... | 372/45 |
| 6,177,684 B1 * | 1/2001 | Sugiyama ....................... | 257/17 |
| 6,239,449 B1 * | 5/2001 | Fafard et al. ................... | 257/17 |
| 6,281,519 B1 * | 8/2001 | Sugiyama et al. .............. | 257/14 |
| 6,369,403 B1 * | 4/2002 | Holonyak, Jr. ................. | 257/13 |
| 6,541,788 B1 * | 4/2003 | Petroff et al. .................. | 257/21 |
| 6,728,281 B1 * | 4/2004 | Santori et al. ................. | 372/45 |
| 6,768,754 B1 * | 7/2004 | Fafard .......................... | 372/43 |
| 6,812,464 B1 * | 11/2004 | Sobolewski et al. ..... | 250/336.2 |
| 6,816,525 B1 * | 11/2004 | Stintz et al. .................. | 372/45 |

FOREIGN PATENT DOCUMENTS

| | | |
|---|---|---|
| EP | 0 875 946 | 11/1998 |
| EP | 0 877 428 | 11/1998 |
| EP | 0 881 691 | 12/1998 |
| GB | 2 215 911 | 9/1989 |
| GB | 2 354 368 | 3/2001 |
| JP | 03-046289 | 2/1991 |
| JP | 11074608 A * | 3/1999 |

OTHER PUBLICATIONS

J. Kim, et al., Nature, vol. 397, pp. 500-503, "A Single-Photon Turnstile Device", Feb. 11, 1999.

S. N. Molotov, et al., JETP Lett., vol. 63, No. 8, pp. 687-693, "Quantum Cryptography Based on Quantum Dots", Apr. 25, 1996.

(Continued)

*Primary Examiner*—David Porta
*Assistant Examiner*—Davienne Monbleau
(74) *Attorney, Agent, or Firm*—Oblon, Spivak, McClelland, Maier & Neustadt, P.C.

(57) ABSTRACT

A photon source comprising:
a quantum dot (21) having a first confined energy level capable of being populated with an electron and a second confined energy level capable of being populated by a hole; and
supply means (23) for supplying carriers to the said energy levels, wherein the supply means are configured to supply a predetermined number of carriers to at least one of the energy levels to allow recombination of a predetermined number of carriers in said quantum dot to emit at least one photon.

33 Claims, 27 Drawing Sheets

OTHER PUBLICATIONS

J. M. Gerard, et al., Journal of Lightwave Technology, vol. 17, No. 11, pp. 2089-2095, "Strong Purcell Effect for InAs Quantum Boxes in Three-Dimensional Solid-State Microcavities", Nov. 1999.

J. M. Gerard, et al., Physical Review Letters, vol. 81, No. 5, pp. 1110-1113, "Enhanced Spontaneous Emission by Quantum Boxes in a Monolithic Optical Microcavity", Aug. 3, 1998.

* cited by examiner

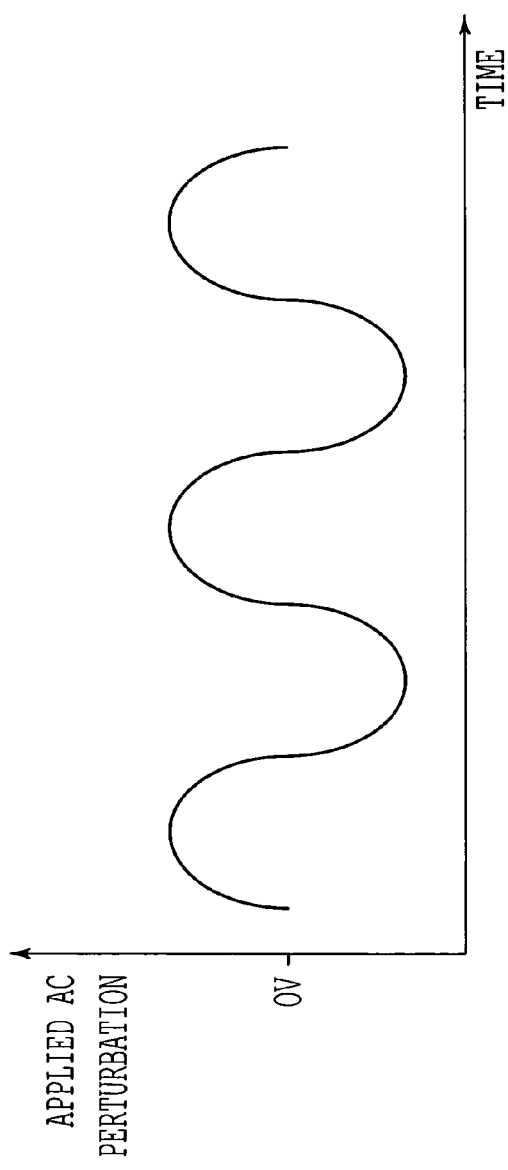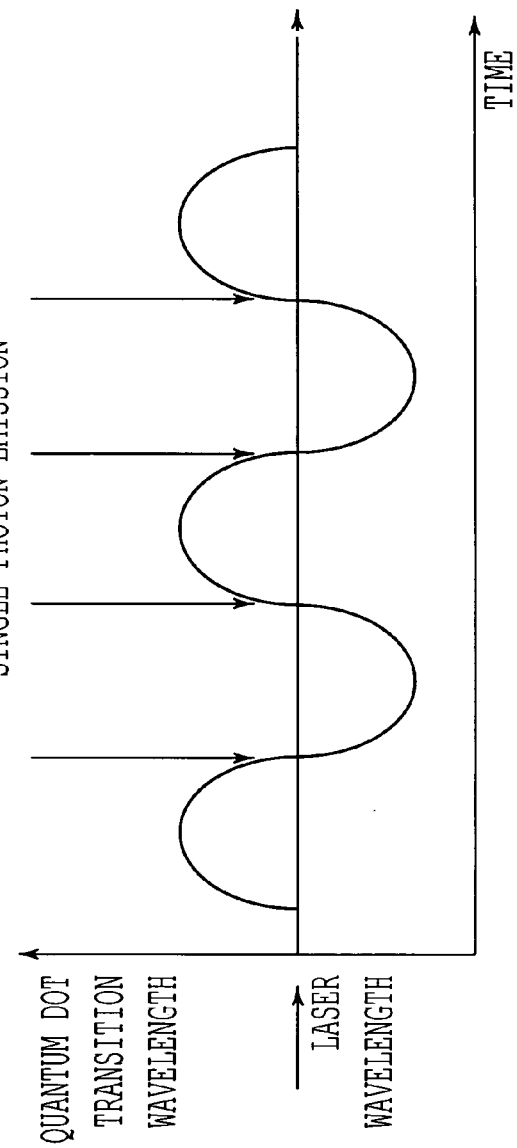

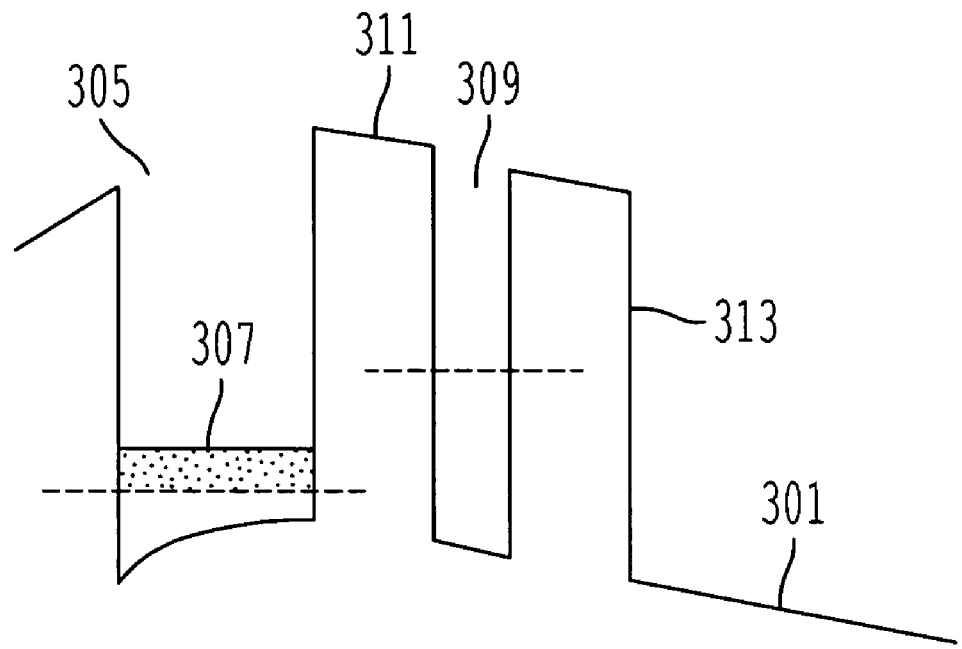
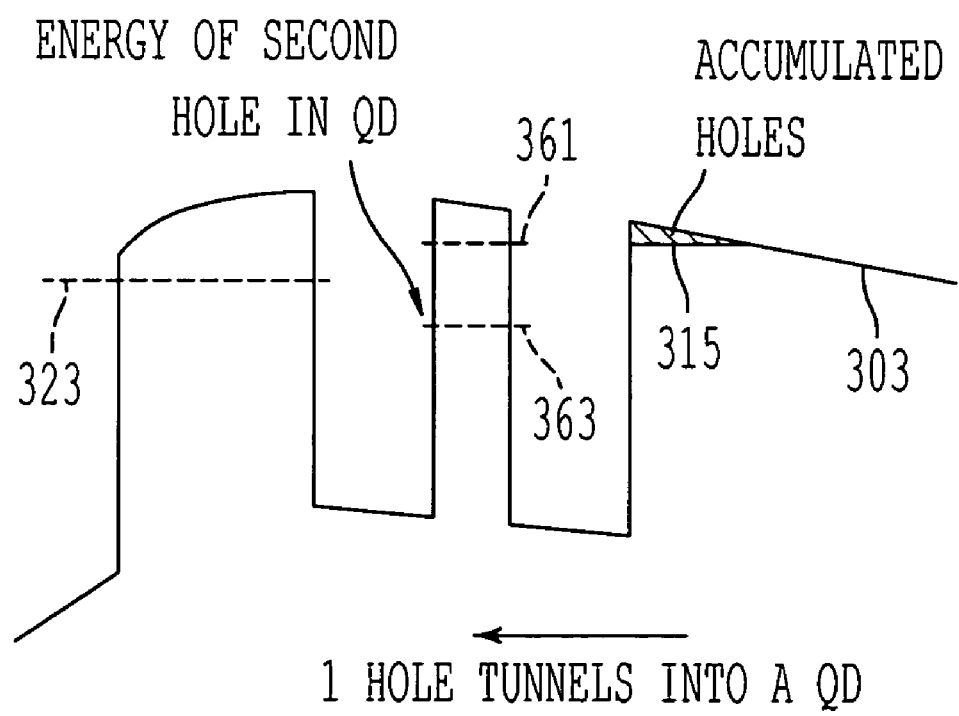
FIG. 26A

PHOTON SOURCE

FIELD OF INVENTION

The present invention relates to a photon source. More specifically, the present invention relates to a photon source which is capable of emitting single photons which are spaced apart by a predetermined time interval or pulses of n photons, where n is an integer can be controlled to the accuracy of a single photon.

BACKGROUND OF INVENTION

There is a need for such so-called single photon sources for use in optical quantum cryptography where, for example, the security key for an encryption algorithm is delivered by a stream of single photons which are regularly spaced in fine. It is essential for the security of this technique that each bit is encoded on just a single photon. This is because an eavesdropper tying to intercept the key will be forced to measure and thereby alter some photons during reading of the communication. Therefore, the intended recipient of the key can tell if the key has been intercepted.

Such a source is also useful as a low-noise source for optical imaging, spectroscopy, laser ranging and metrology. Normal light sources suffer from random fluctuations in the photon emission rate at low intensities due to shot noise. This noise limits the sensitivity of many optical techniques where single photons are detected. A single photon source which produces photons at regular time intervals has a reduced shot noise.

Previously, single photon sources have been envisaged by strongly attenuating the emission from a pulsed laser source. Such a source is shown in FIG. 29. The optical beam 201 is fed through an attenuator 203. The attenuator is configured so that the average number of photons transmitted is about 0.1. Since single photons are indivisible, his means that about 10% of the periods will contain a single photon, while 90% of them are empty.

This method has two serious drawbacks. First, there is still a small probability of finding two photons within one period. A significant number of these two photon emissions would seriously impinge on the security of the device for quantum cryptography. The second problem is that most of the periods are empty and hence carry no information. Thus, the time which it takes to send the key is increased, and also, the maximum distance over which it can be transmitted is limited. The distance limitation problem arises from the fact that optical quantum cryptography is only effective when the rate of detected photons is much higher than the 'dark count' rate of the detector. Therefore, a system with a high emission rate source can tolerate more transmission loss, and therefore a longer transmission distance medium before being overwhelmed by the detector dark count.

A single photon emitter is also being proposed by J. Kim et al in Nature, 397, p 500 (1999). The device proposed here utilises an etched single quantum dot. Single electrons and single holes are injected into the etched structure for recombination. The structure suffers from difficulties in injecting a predetermined number of both electrons and holes into the dot for recombination. Also, the proposed fabrication mode is awkward. Also, the method described of forming the quantum dot by etching produces a large number of non-radiative centres, which drastically reduces the emission efficiency of the device and leads to most of the injected electron-hole pairs being lost through non-radiative recombination.

SUMMARY OF THE INVENTION

The present invention seeks to address the problems of the above devices. In a first aspect, the present invention provides a photon source comprising a quantum dot having a first confined energy level capable of being populated with an electron and a second confined energy level capable of being populated by a hole; and supply means for supply carriers to the said energy levels, wherein the supply means are configured to supply a predetermined number of carriers to at least one of the energy levels to allow recombination of a predetermined number of carriers in said quantum dot to emit at least one photon.

The present invention is capable of emitting a single or n photons at a predetermined time (where n is an integer). The present invention may be used to produce a stream of single or n photons at predetermined time intervals. For instance, it would produce a cyclic generation of single or n-photons spaced by constant time intervals.

The present invention is capable of being configured to product a single photon or a group of n photons at a predetermined time. It may also be configured to repetitively produce single photons or groups of n photons at a predetermined time or times. The time between successive photon emissions can be controlled, successive photon emissions (be it single photons or n photons) will preferably be regularly spaced in time. Although, the source may be configured to irregularly space successive photon emissions.

The first confined energy level is commonly termed a conduction band energy level and the second confined energy level is known as a valence band energy level. The present invention operates by controlling the number of carriers which is supplied to either the conduction band level or the valence band level or both.

It is apparent to persons skilled in the art that, in a quantum dot, there may be a first confined energy level which is a ground state, and subsequent further excited conduction band levels. Similarly, the quantum dot may have more than one confined valence band level. Thus, there are several possible optical transitions of a quantum dot which can absorb a photon.

Preferably, the supply means of the present invention are configured to supply a steam of single (or an integer number n) carries at predetermined time intervals to the at least one energy level. Further, the steam of single (or n) carriers are configured so that a stream of single (or n) photons are emitted at predetermined time intervals. The source may be configured as a single electron source wherein single carriers are repetitively supplied to the said at least one energy level such that a single photon stream is produced. In such a single photon stream, each of the single photons are separated from one another by predetermined time intervals.

The supply means fulfills two functions, it supplies carriers to the confined energy levels, in addition, it also controls or triggers the supply of carriers to the energy levels.

The supply of carriers to the relevant energy levels, in addition to the control of the supply of carriers can be achieved in a number of different ways.

The photon source may be radiated with radiation which is configured to excite a predetermined number of electrons and holes within the first and second energy levels respectively.

As previously mentioned, there may be many conduction band levels into which electrons can be excited, similarly, there may be many valence band levels. If an electron is supplied to an excited energy level of the conduction band then the electron will almost certainly relax into a lower energy state or the ground state of the conduction band prior to recombining with a hole. The time which a carrier spends in a energy state before relaxing to a lower energy state is known as the 'relaxation time'. As used hereinafter, the relaxation time will be taken to mean the average time which a carrier remain in an energy state before releasing to another energy level. As used hereinafter, the recombination time will be taken to mean the average time it takes for an electron and hole to recombine. Usually carriers will undergo relaxation more quickly than recombination. This is especially true when the carriers are created in the excited levels of the quantum dot, as in this case, the carriers usually relax to the ground states of the quantum dot before recombinations. However, in some situations, relaxation may occur by recombination.

An electron from the ground state may recombine with a hole to emit a photon. Alternatively, an electron from an excited state may recombine with a hole to emit a photon. It should be noted that although it is possible that an electron from a higher energy state to combine with a hole, the probability of this transition occurring is very small, as it is far more likely that the electron will first relax into the ground sate prior to recombination.

To excite the carriers into the conduction and valence bands for recombination, the source is illuminated with radiation which is configured to excite either a ground state transition within the quantum dot or, an excited transition. This is achieved by tuning the wavelength of the radiation to the appropriate optical transition energy of the quantum dot. The required transition energy may be that to excite an electron into the ground state of the conduction band and a hole into the ground state of the valence band of the quantum dot. Alternatively, it may be required to supply the electron and/or hole into one of the excited energy levels of the quantum dot. In the quantum dot, the confined conduction band (valence band) levels can only accommodate a maximum of two carriers. One of these carriers is of a spin up and the other electron is of a spin down configuration.

It is possible to configure the structure so that only one electron is excited into a level of the quantum dot by the radiation. This can be done by either polarizing the incident light so that it is circularly polarized with a single orientation direction (i.e., either left or right), or a magnetic field can be applied to the device to lift the spin degeneracy of the conduction band level. Only one electron can then be accommodated in a single conduction band level.

Also, the absorption of the first electron hole pair by the dot results in a shift in the transition energy of the dot. The spectral line width of the laser can be tuned to be smaller than this shift in energy. Thus, only a single electron hole pair can be excited at a time.

For the purpose of explaining the operation of the device, it will be assumed that there is only one electron in the conduction band of the quantum dot. A hole will also be excited into the valence band layer when the electron is supplied to the conduction band layer.

The electron and the hole will recombine to emit a photon during a characteristic time called the recombination time. If the incident radiation has an energy equal to that of the lowest energy transition energy of the quantum dot and the radiation is pulsed with a duration shorter than the relaxation time, then by the time the electron and hole have relaxed, no radiation is present to excite a second electron and hole. Therefore, only a single photon is emitted.

Also, the time between the leading edges of the incident pulses should be longer than the recombination time. This is to prevent a second pulse arriving at the quantum dot before the electron and hole have recombined.

If the radiation photon energy is tuned to the energy of an excited (i.e. not lowest energy) transition of the quantum dot, the photoexcited electron and hole will relax to their ground energy levels in the dot before recombination. If the duration of the pulse is shorter than the relaxation time, then only a single electron and hole can be excited per pulse of the exciting radiation. Therefore, only a single photon is emitted.

If the conduction band contains two electrons, the two photons which are emitted can be separated by filtering out the unwanted photons with a polarizor. If two electrons recombined with two holes, then the two photons emitted will have different polarizations. Therefore, a polarization splitter will allow a regular stream of single photons with predetermined polarization to be produced.

Also, if the degeneracy of the levels is lifted by a magnetic field, the emitted photons will have different energies depending on the specific transition. Hence, it is possible to filter out photons emitted at the other energies to obtain a stream of single photons.

In order to excite a particular transition in the dot, i.e. in order to populate a certain conduction band level (i.e. the ground state or an excited level), the dot is irradiated with radiation having an energy substantially equal to that of the required energy level.

Often it is convenient to prepare a device with more than one quantum dot. Often these quantum dots possess different transition energies due to fluctuations in their size or composition. In this case, the emission from a single quantum dot may be isolated by filtering the wavelengths of the emitted light. By allowing only the light in a narrow bandpass to pass it is possible to collect the emission of a single dot and exclude that of the others.

Preferably, the area of the source from which light is collected contains at most one thousand optically active quantum dots.

Alternatively, it is possible to selectively excite a single quantum dot by using a laser with a narrow wavelength spectrum. The laser will excite only the quantum dot which has a transition energy equal to the laser energy.

It is also possible to produce an n-photon source if a dot is produced which has transition energies which lie close enough to one another such that it is possible to excite more than one transmission at a time. Another possible way to produce an n-photon source is to use several excitation wavelengths in the incident pulse.

In these devices with more than one quantum dot, it is possible to change the quantum dot from which light is collected by changing the wavelength bandpass energy or the laser energy.

The selected population of an electron or hole level can also be achieved using continuous radiation (i.e., non-pulsed). If the photon source is irradiated with radiation corresponding to a particular transition energy within the quantum dot, the population of the quantum dot level can be controlled by periodically varying the transition energy of the quantum dot. This can be done in many ways, for example, the electric field across the dot may be varied by an applied AC voltage. Also, the carrier density of the dot or surrounding layers, the magnetic field applied to the quantum dot and even the temperature of the quantum dot can all be modulated to vary the transition energy of the quantum dot.

The transition energy of the quantum dot can be modulated so that the confined energy level is only capable of being populated by carriers for a certain time. This should be less than the relaxation time of the photoexcited electron-hole pair. Therefore, although the radiation intensity is constant, light can only be absorbed by the quantum dot for the short time that the transition energy equals radiation energy. The electron and hole can then recombine to emit a photon in the same way as described with reference to excitation by the pulsed laser. Sometime later, the transition energy of the quantum dot will be swept through the laser energy again and the dot is able to absorb an electron and hole again. Again, the degeneracy of the level may be lifted by application of a magnetic field or, a single electron may be introduced into the level by polarization of the incident radiation. As before, the emitted radiation can be filtered to remove emitted light from the specific polarization or to remove photons which arise due to recombination within other quantum dots.

Previously, the discussion has concentrated on illuminating the device in order to supply carriers for the conduction valence band. However, the present invention may also operate by populating either of the conduction or valence bands by injection of carriers into the conduction or valence band level. In such a structure, in order to obtain fine control, it is preferable if either the conduction band levels or the valence levels are continually populated with excess carriers. The remainder of the discussion will concern a device where the valence band levels are populated with excess holes and electrons are inject into the conduction band. However, it will be appreciated that the inverse device can be fabricated where the conduction band levels are populated with excess electrons, and holes are injected into the valence band.

The holes are preferably provided to the valence band of the quantum dot via a doped barrier. Such a doped barrier will preferably be a remotely doped or modulation doped barrier which is separated from the quantum dot by a spacer layer.

Preferably the quantum dots are placed with a two dimensional excess carrier gas so as to provide the excess carriers.

Preferably at least one ohmic contact is made to the two dimensional carrier gas so as to repopulate the carrier gas after recombination of an excess carrier with an injected carrier.

Electrons are injected into a conduction band level of the dot. As with the previously described optically by excited sources, the injected electron and a hole recombine and emit a photon. To avoid more than one photon emission, the electrons are preferably injected one at a time. A particularly preferable way of injecting the electrons is to use resonant tunnelling through a barrier layer. Here, the energy of the injected electrons is matched to the energy of a conduction band level in the quantum dot. To achieve selected injection of electrons, the energy of the electrons to be injected is periodically varied so that the device is switched between an ON state (where the energy of the injected electrons aligns with that of the conduction band level within the quantum dot) and an OFF state (where the injected electrons do not align with the conduction bands within the quantum dot). In the OFF state, electrons cannot tunnel into the quantum dot.

The present invention may comprise a plurality of quantum dots. In such a device, it is virtually impossible to make a plurality of quantum dots which will have identical transition energies. Therefore, it is possible to select emission from a single quantum dot by filtering the wavelengths of the collected light. There is also a variation in the transition energy from dot to dot which may be due to fluctuations in the size or composition of the dots for instance. Thus, it is possible to selectively inject carriers into just one of the quantum dots.

In the above described device, this can be achieved by precise control of the voltage in the "ON" state. Alternatively, it may be possible to control the energy of the illuminating radiation to excite a transmission in a single dot.

Preferably, the area of the source from which light is collected should contain, at most 1000 optically active quantum dots.

Once the photos in emitted from the quantum dot, it can be collected by an optical fibre. Preferably, the device is provided with a coupling means to allow the photons to be efficiently collected by a fibre optic cable. Such coupling means may comprise antireflection coating located on the surface of the device through which the emitted photons are collected. Also, the antireflection coating could be located on the optical fibre itself.

The coupling means may also comprise a lens to collect emitted photons.

A particularly preferable arrangement of the device is achieved if the source has a mirror cavity which has two mirrors located on opposing sides of the quantum dot. Preferably, one of the mirrors (ideally the mirror closest the output surface) is partially reflective such that it can transmit the emitted photons. More preferably, the energy of the cavity mode for said mirror cavity is preferably substantially equal to that of the emitted photons. Further, it is preferable if the distance between the two mirrors $L_{cav}$ of the cavity is defined by $$L_{cav} = \frac{m\lambda}{2\pi_{cav}}$$

where m is an integer, $n_{cav}$ is the average refractive index of the cavity and $\lambda$ the emission wavelength (in vacuum).

The advantage of using a cavity is that it allows more of the emitted light to be coupled into the numerical aperture of the collecting fibre or optic. The cavity mode of the resonant cavity is emitted into a narrow range of angles around the normal to the mirrors. The fibre/collection optic is arranged to collect the cavity mode.

At least one of the minors may be Bragg mirror comprising a plurality of alternating layers where each layer satisfies the relation:

$$n_a t_a = n_b t_b = \lambda/4$$

Where one dielectric layer (A) has a refractive index of $n_a$ and a thickness of $t_a$ and second dielectric layer (B) has a refractive index of $n_b$ and a thickness of $t_b$.

At least one of the mirrors may also comprise a metal layer. A phase matching layer should also be located between the cavity and the metal layer, so that an antinode is produced in the cavity mode at the interface between the cavity and phase matching layer. At least one of the mirrors may even be a semiconductor/air or semiconductor dielectric interface.

In the device with multiple quantum dots, the cavity in preferably designed so that only one of the quantum dots has an emission energy which couples to the cavity mode. This can be used to ensure that emission from only one dot is collected producing just single photons.

In this case, the energy width or band-pass of the cavity mode should be approximately equal to the linewidth of the emitting quantum dot. This can be achieved by configuring the design of the cavity as required—in particular the reflectivities of the cavity mirrors.

The width of the cavity mode decreases with increasing mirror reflectivity. The mirror reflectivities can be increased by increasing the number of periods in a Bragg mirror.

The device has been described with one optical fibre. However, it will be appreciated that the device can be fabricated with more than one quantum dot emitting into more than one fibre.

A particularly preferable method for fabricating the quantum dot(s) of the present invention is by use of a self-assembling growth technique (such as the Stranskii Krastinow growth mode). Therefore, in a second aspect, the present invention provides a method for the fabrication of a single photon source, the method comprising forming a quantum dot layer by growing a layer of a first material on a second material, wherein there is a variation in the lattice constants between the first material and the second, the first material being deposited in a layer which is thin enough to form a plurality of quantum dots, the method further comprising providing supply means for supplying carriers to the said energy levels, wherein the supply means are configured to supply a predetermined number of carriers to at least one of the energy levels in the quantum dots to allow recombination of a predetermined number of carriers in said quantum dot to emit at least one photon.

Typically, the first material will be InAs, InGaAs or InAlAs and can be grown to a thickness of preferably less than 50 nm. The second material will preferably be GaAs or AlGaAs.

Preferably the method of the second aspect, will further comprise the step of forming a layer of a third material overlying the first material. The third material may be the same as the second material.

The areal density of the quantum dots is preferably less than $3 \times 10^7$ cm$^{-2}$.

The source can also be used to produce pairs of entangled photons. An entangled photon source can also be used for quantum cryptography. Quantum cryptography using entangled photons has been described by Tittel et al, Phys Rev Lett 84, 4737 (2000), Naik et al, ibid 84, 4733 (2000), and Jennewein et al ibid 84, 4729 (2000). These papers used a non-linear crystal to generate the entangled photon pairs. The devices of the above aspects of the present invention have the advantage of producing entangled photons at well-determined times, and at higher emission rates, while suppressing the simultaneous emission of two entangled photon pairs.

Where the supply means comprises incident radiation, the quantum dot is illuminated with a laser power so as to excite two excitons during each excitation pulse. The incident light may be linearly polarized. Linearly poled light contains an equal mixture of the two senses of circular polarization (i.e. clockwise and anti-clockwise) and can therefore excite both the optically active exciton spin states of the quantum dot. Other polarization states of the incident radiation may also be used.

In this particular configuration, the intensity of the incident light is set so as to have a high probability of exciting two excitons in the quantum dot.

The optically-excited bi-exciton state inside the dot can form the maximally entangled state $$\psi=(|\sigma^+>1|\sigma->2 +|\sigma->1|\sigma^+>2)/2^{0.5}$$

of the two optically active spin states σ+ and or σ−, where the subscripts 1 and 2 refer to the first and second emitted photons.

After excitation of the biexciton state, the quantum dot will emit a first photon, leaving behind a (single) exciton in the quantum dot. Sometime later, this exciton will also recombine, thereby emitting a second photon. The polarization states of the first and second photon will be entangled, provided that spin scattering is weak, so that the (single) exciton state does not scatter before emission of the second photon.

The first and second emitted photons will have different photon energies, allowing them to be separated using a dichroic beamsplitter. In the methods of entangled-photon quantum cryptography described by Tittel et al, Naik et al, and Jennewein et al, one of the photons is sent to Alice and the other to Bob.

Where the carriers are supplied by electrically injecting carriers into either the valence or conduction bands, the level of the voltage pulses is adjusted so as to allow the tunnelling of two (rather than one) carriers into the quantum dot during each pulse. The quantum dot will thus emit two photons, which will be entangled as described above. The two emitted photons can again be separated using a dichroic beamsplitter.

Although terms such as supply means, modulating means for carrying out specific functions have been used, any combination of the means could be used to implement the invention.

In a third aspect, the present invention provides a photon source composing a quantum dot having a first confined energy level capable of being populated with an electron and a second confined energy level capable of being populated by a hole; and a supply device supplying carriers to the said energy levels, wherein the supply device is configured to supply a predetermined number of carriers to at least one of the energy levels to allow recombination of a predetermined number of carriers in said quantum dot to emit at least one photon.

In a fourth aspect, the present invention provides a method of fabricating a photon source, the method comprising fog a quantum dot layer by growing a layer of a first material on a second material, wherein there is a variation in the lattice constants between the first material and the second material, the first material being deposited in a layer which is thin enough to form a plurality of quantum dots, the method further comprising providing supply device supplying carriers to the said energy levels, such that a predetermined number of carriers are supplied to at least one of the energy levels in the quantum dots to allow recombination of a predetermined number of carriers in said quantum dot to emit at least one photon.

The supply device can be used to optically or electrically supply carriers to the energy levels as previously described. For example the supply device may be a radiation source, or a voltage source or the like.

In a fifth aspect, the present invention provides a method of operating a photon source, wherein the photon source comprises:

a quantum dot having a first confined energy level capable of being populated with an electron and a second confined energy level capable of being populated by a hole; the method comprising:

supplying carriers to the said energy levels, such a predetermined number of carriers are supplied to at least one of the energy levels to allow recombination of a predetermined number of carriers in said quantum dot to emit at least one photon.

The applicants have surprisingly found that the photon emission rate for minority carriers injected into a quantum well which supports an excess population of electrons is fast compared to the case where both carrier types are injected in small concentrations into a quantum well. In this latter case, the recombination is excitonic and is governed by the relevant energy-momentum conservation rules resulting in a decay time of about nanoseconds. In of recombination of a minority carrier in a low dimensional carrier gas, excess carriers may be involved in the recombination process which relax the energy momentum conversation rules.

The efficiency of a light source is, to a large extent, governed by the relative rates of radiative and non-radiative recombination. A raster radiative recombination rate results in a higher efficiency given the same non-radiative recombination rate.

Thus, in a sixth aspect, the present invention provides a photon source comprising:

an active layer having a low dimensional carrier gas with an excess of carriers of a first type; and tuning and injection means for varying the excess carrier concentration of carriers of the first type in the active layer and for injecting a carrier of a second type into the active layer such that radiative recombination can occur between the carrier of the second type and a carrier of the first type, wherein carriers of the second type have the opposite polarity to those of the first type.

The source will be described with electrons as carriers of the first type and holes as carriers of the second type. Although, it will be appreciated that the carriers of the first type may be holes and the carriers of the second type may be electrons.

In a low dimensional structure a single or a plurality of discrete energy levels will be defined in the conduction band of a quantised system such as a 2D, 1D or 0D low dimensional gas. These conduction band levels are capable of being populated by electrons. Similarly valence band states or level are set up in the valence band and such states are only capable of being populated by holes.

The carriers of the second type need to be injected into the active layer, this may be achieved by resonant tunnelling. If the structure is configured to allow resonant tunnelling, then it will be possible to configure the source to allow injection of carriers into the active layer under predetermined operating conditions.

The second type carrier or carriers can resonantly tunnel into the active layer when a valence band energy level in the active layer aligns with the energy of the injected carriers.

Therefore, preferably, the active layer will have a confined energy level capable of being populated with a carrier of a second type and the tuning and injecting means can be configured to inject second type carriers at the energy of the confined energy level.

Preferably, the source will further comprise a tunnel layer. This layer will be located such that a carrier or carriers of the second type will tunnel from this layer into the active layer. The tunnel layer will preferably be capable of supporting a low dimensional carrier gas having a confined energy state which is capable of being populated with a carrier of the second type, said tuning and injection means being capable of aligning the confined energy state of the tunnel layer with the confined energy state of the active layer. Although the tunnel layer will be capable of supporting a low dimensional carrier gas, the tunnel layer will usually not hold any excess carriers, unless these carriers are about to tunnel into the active layer.

The tunnel layer can act as a valve which can only allow the passage of holes if a valence band level in the tunnel layer aligns with that of the valence band level in the active layer.

By injecting minority carriers one-by-one into the active layer, a single photon source can be realised. The addition of one minority carrier resulting in the emission of a single photon. If the radiative recombination rate is enhanced the uncertainty or 'jitter' in the time of photon emission is reduced. The reduction of 'jitter' is important in, for example, quantum cryptography. This is because the detector to which the single photon is sent is usually gated so as to be sensitive for only a short period of time corresponding to the expected arrival time of the photon. A large jitter means that the detector must be sensitive for a long time which results in a higher backgrounds noise and lower photon detection efficiency.

Also, the efficiency of the source is increased as described for the multiple photon source.

The present invention may be configured as a single photon source. For such a source, it is required to introduce carriers of the second type (in this description holes) into the active layer one by one. This is possible if the tunneling layer comprises a quantum dot. The aligned valence band layer of the quantum dot can only accommodate a single hole at a time. Therefore, it is possible to introduce holes one by one into the active layer by varying the tuning means to align a valence band level in the tunnel layer with a valence band layer in the active layer.

More explicitly this can be achieved because under a certain bias condition (which can easily be determined for the particular source though experiment) an energy level of the quantum dot becomes resonant with the hole reservoir region. When a hole tunnels into the quantum dot increased coulomb repulsive interaction between the holes prohibits subsequent hole tunnelling into the same dot. In this way, the quantum dot is filled with only one minority carrier. The bias is further increased to bring this filled quantum dot hole state into resonance with a confined valence band site in the quantum well. The hole may then tunnel into the active layer.

However, in order for the hole to be in the tunnel layer read to tunnel into the active layer, the hole must usually tunnel into the tunnel layer. Typically, it will be possible to operate the injection and tuning means, such that only a valence band level in the tunnel means aligns with the carrier energy of the carriers entering the tunnel layer to allow a single hole to tunnel into the tunnel layer. (In other words, tunneling of holes into the active layer will be blocked).

Then, the injection and tuning means will be configured to align a valence band level of the tunnel layer with that of a valence band level of the active layer. Thus, the hole can tunnel from the tunnel layer into the active layer where it can recombine with an electron.

Using the above operation, it will be possible to control the flow of holes into the active layer with the tuning means such that the holes can be introduced one-by-one into the active region for recombination.

The idea of using the injection and tuning means to switch between two states where the first state allows tunnelling into the tunnel layer and the second state allows tunnelling from the tunnel layer to the active layer, can also be used when the tunnel layer can hold more than a single hole. For example, when the tunnel layer has just two dimensional confinement.

The tuning and injection means have been introduced together. However, they perform two distinct functions: a 'tuning function' to vary the carrier concentration of the active layer to maximise the radiative recombination rate and an 'injection function' to inject carriers into the active layer. These functions may be performed by two separate components for example, two gates where one gate varies the carrier concentration and the other varies, for example, the band structure to allow or prohibit resonant tunnelling. However, hey could both be performed to a certain extent by a single component. Alternatively, a plurality of components could be used to effect both functions, but where a component did not exclusively affect either the tuning or the injection.

The tuning and injection means may be provided by electrodes, for example, a gate type electrode where a voltage applied to the gate affects transport within a remote layer or heavily doped layers which may be used to apply a DC bias across the device. Gates may be provided on one or both sides of the active layer, tunnel layer and the reservoir region. These gates may be embedded gates or surface gates.

Typically, ohmic contacts may be provided to the active layer and a gate may be provided such that variation of the gate bias with respect to the ohmic contacts serves to vary the carrier concentration in the carrier gas in the active quantum well.

Preferably, a second gate is provided in addition to the first gate. The second gate will generally be located on an opposing side of the active layer to the first gate. The provision of two gates allows finer control over the source. Thus, it is possible for there to be a range of different excess carrier concentrations for a particular injection condition of a second type carrier. An injection condition being a particular alignment of energy levels for resonant tunnelling or a particular injection energy if resonant tunnelling is not used to introduce carriers into the active layer.

The first gate will primarily control the excess carrier concentration in the active layer (or 'tune' the source) and the second gate will primarily control the band structure to align the levels for resonant tunnelling (or control the injection). However, in some device configurations the two gates may affect both tuning and injection and the bias applied to both gates will need to be changed in order to vary the carrier concentration for a particular injection condition.

Typically, the source will further comprise a reservoir region which will comprise excess carriers of the second type.

Preferably, a first barrier is provided so that minority carriers tunnel through this barrier before entering the active layer. If a tunnel layer is present, this barrier layer will be provided between the tunnel layer and the active layer. More preferably, a second barrier is provided before the carriers enter the tunnel layer. If a reservoir region is provided this layer will preferably be located between the reservoir region and the tunnel layer. The barriers may be a single layer or they may be a plurality of layers. A barrier layer will have a larger bang-gap than those of the layers which it separates. For example, the first barrier will have a larger band-gap than the active layer and the tunnel layer. The second barrier layer will have a larger band-gap than the tunnel layer and the reservoir region.

A third doped barrier layer is also preferably provided to provide excess carriers to the active layer. The third barrier layer may be a modulation doped barrier layer comprises a doped barrier layer and an undoped spacer layer adjacent the active layer.

Generally, carriers of the second type will be injected generally perpendicular to the active layer. The term generally perpendicular should be understood as meaning that the second type carriers are not injected in the plane of the active layer but are instead injected from a layer which is formed above or below the active layer during growth of the structure. Of course, the second type carriers could be injected within the plane of the active layer.

In a seventh aspect the present invention provides a method of operating a photon source, the photon source comprising:
an active layer having a low dimensional carrier gas with an excess of carriers of a first type; the method comprising:
varying the excess carrier concentration to maximise the radiative recombination rate and injecting a carrier of a second type into the active layer for radiative recombination with a carrier of the first type; wherein carriers of the second type have the opposite polarity to those of the first type.

More preferably, varying the excess carrier concentration will comprise maximising the excess carrier concentration of the active layer.

Even more preferably, the step of varying the excess carrier concentration will comprise the step of biasing a gate with respect to said active layer.

The step of injecting a carrier of the second type will preferably comprise the step of applying a bias to a gate to affect the band structure of the source to allow resonant tunnelling of a second type carrier into the active layer.

In an eighth aspect, the present invention provides a photon source comprising an active layer having a low dimensional carrier gas with an excess of carriers of a first type; and a tuning and injection device varying the excess carrier concentration of carriers of the first type in the active layer and for injecting a carrier of a second type into the active layer such that radiative recombination can occur between the carrier of the second type and a carrier of the first type, wherein carriers of the second type have the opposite polarity to those of the first type.

The tuning and injection device may be a voltage source configured to perform the above described tuning function and injection function.

BRIEF DESCRIPTION OF THE DRAWINGS

The present invention will now be described with reference to the following preferred, non-limiting embodiments in which

FIG. 16 shows a plot showing the variation in AC perturbation with the quantum dot transition wavelength of the embodiment of FIG. 13;

DETAILED DESCRIPTION OF THE INVENTION

Figure 1:
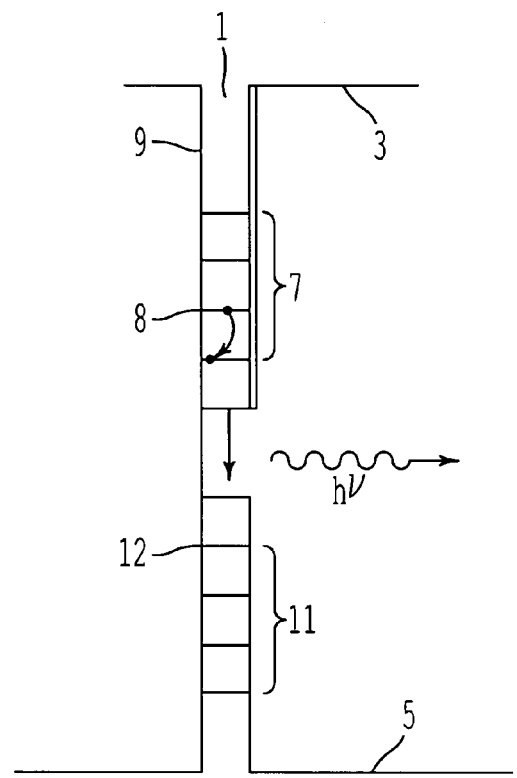
FIG. 1 shows a schematic band structure of a single quantum dot.

FIG. 1 shows a schematic band structure of a single quantum dot 1. The quantum dot forms a minimum in the conduction band 3 and a maximum in the valence band 5. A plurality of quantised conduction band levels 7 are formed in the minima 9 and a plurality of valence band levels 11 are formed in valence band maximum 13.

When a conduction band level 8 is populated by electron 15 and a valence band level 12 is populated by hole 17, the electron and hole recombine. Recombination of the single electron and a single hole results in the emission of a single photon.

The recombination of an electron and hole does not incur the instant that an electron and a hole populate the combined energy levels 7, 11. Instead, there is, on average, a finite delay between the population of the two levels and the emission of a photon. This is known as the "recombination time". In a beam of conventional laser light, there are many photons. It is impossible using attenuation of a laser beam alone to obtain a regular stream of photons. However, in the quantum dot shown in FIG. 1, a photon is emitted only when an electron and hole recombine. Therefore, providing that electrons and holes can be supplied to the dot one by one at regular time intervals and that the recombination time is shorter than the time between population of both confined energy level 7, 11, a stream of single photons can be produced.

The above described situation where an electron is excited into the conduction band and then recombines with a hole is an oversimplification of the process. The electron can occupy any one 8 of a plurality of levels 7 in the conduction band 9. If the electron and hole in the quantum dot are excited optically, then the actual level 8 occupied by the electron and hole initially, is dependent on the wavelength (or energy) of the incident light. The actual level 8 occupied by the electrons is, initially dependent on the wavelength (or energy) of the incident light. The electron may be excited into the ground state conduction band level from which it will decay to recombine with a hole, or it may be excited into an excited conduction band level. From such an excited level, the electron will most probably relax into a lower energy level in the conduction band before recombination. The time which a carrier takes to transfer from an excited level to a lower level is known as the "relaxation time". Generally, it is more statistically favourable if the carrier decays from an excited state to the ground state conduction band before recombination.

Figure 2:
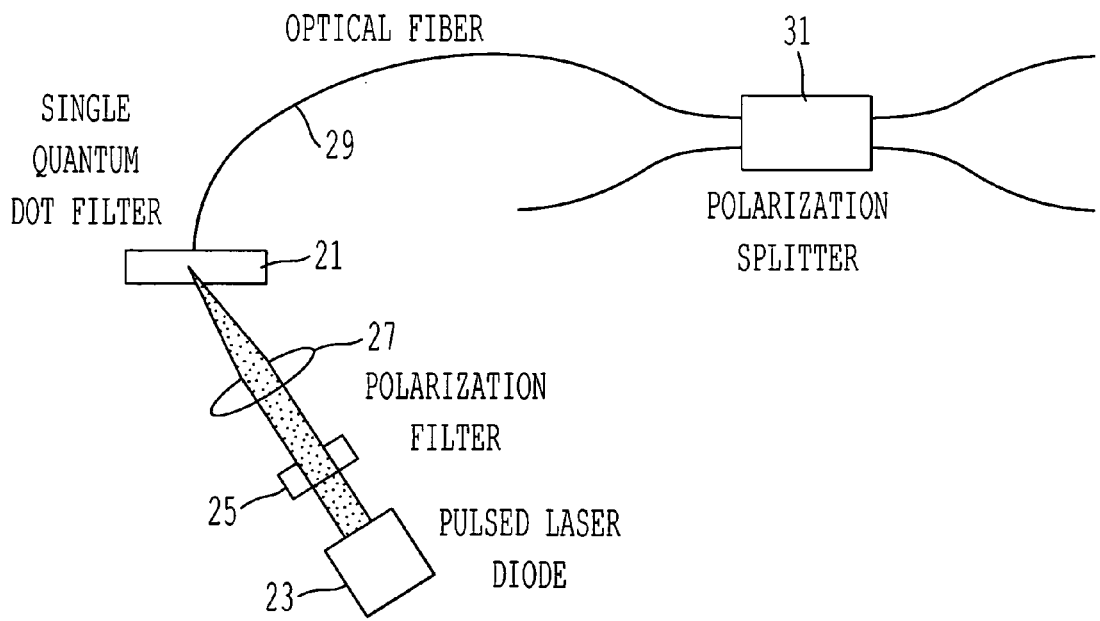
FIG. 2 shows a quantum dot filter for a single dot in accordance with an embodiment of the present invention.

FIG. 2 shows an embodiment of the present invention. Here, the electron 15 and hole 17 are excited into the confined energy levels 7, 11 restively by excitation of the photon source 21 by a pulsed laser diode 23. A first pulse arrives at the quantum dot and excites an electron hole pair. Once an electron hole pair is excited, no further radiation can be absorbed by the dot. The pulse duration should be shorter than the relaxation time of the carriers. If the pulse duration was longer than the relaxation time then a carrier which had been excited into an excited conduction band level might relax during illumination of the dot. This would mean that a second electron/hole pair could be excited in a single pulse of radiation. The time between the leading edge of subsequent pulses should be longer than the recombination time so as to allow excitation of an electron-hole pair by the next pulse. Therefore, the electron and hole pair should recombine before the next pulse arrives. By using this technique, it is possible to produce a stream of single photons.

In FIG. 2, the laser pulse is passed through a polarization filter to select the required polarization, be it one of the orthogonal components of left or right circularly polarized. The polarized beam is then focused onto the single photon source 21 by lens 27. The output from single photon source 21 is then coupled into optical fibre 29. Optical fibre 29 is then fed through polarization splitter 31 which is capable of separating the two orthogonally polarized components of the emitted photon beam.

Figure 3:
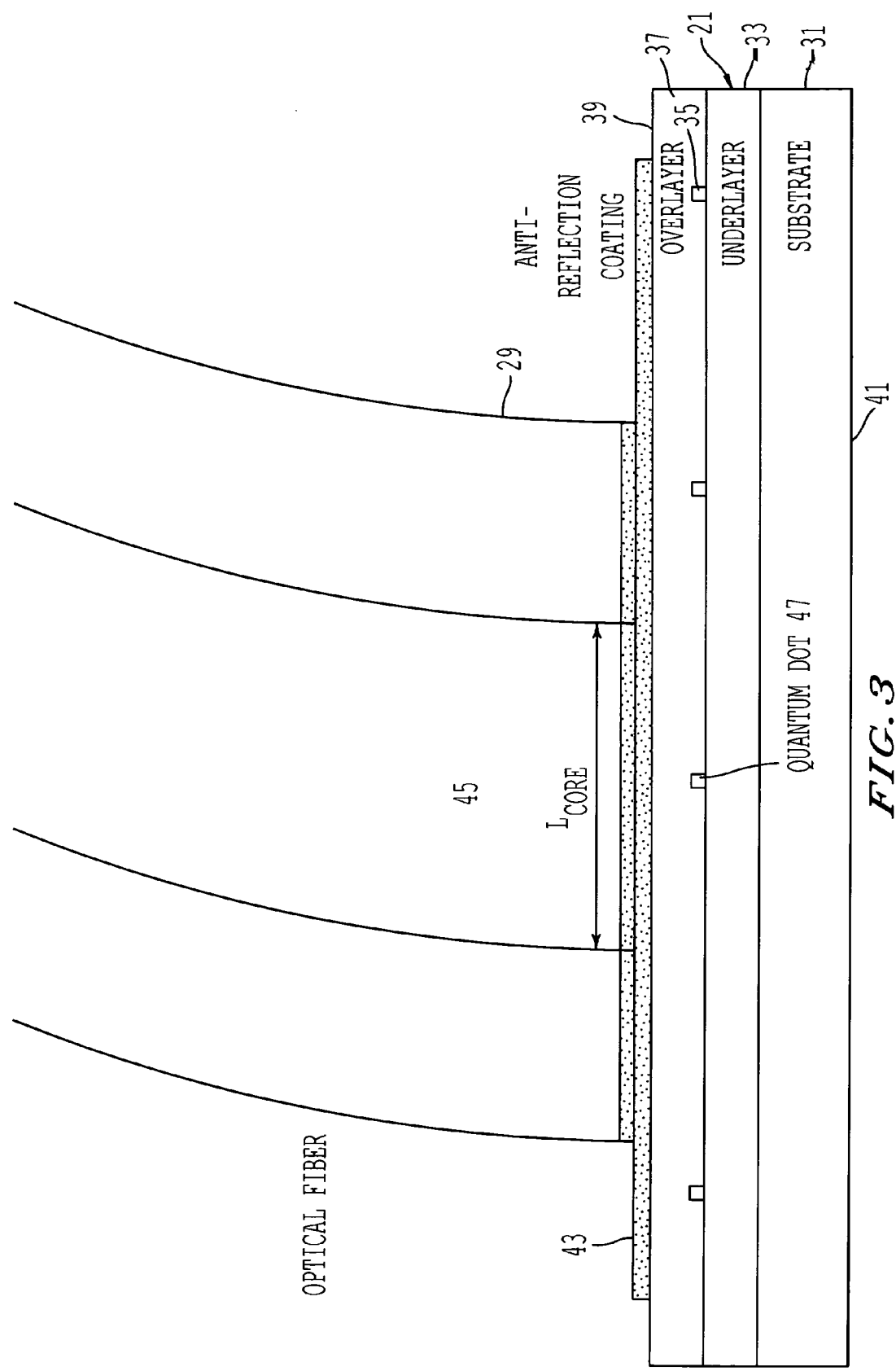
FIG. 3 shows a single photon either according to an embodiment of the present invention coupled to an optical fibre.

FIG. 3 shows the coupling between device 21 and optical fibre 29 in more detail. Device 21 comprises an under layer 33 formed on an upper surface of substrate 31. A dot layer 35 is then formed on an upper layer of under layer 33 and an over layer 37 is then formed overlying dot layer 35. The top surface 39 of over layer 37 is an output surface. Single photons emitted from the quantum dot layer 35 are transmitted through this surface 39. The beam from the pulsed laser diode 23 is incident on the lower surface 41 in this example. However, it should be noted that the beam could also be incident on the upper surface or side of the device.

An anti-reflection coating 43 is formed overlying the output surface 39. Optic fibre 29 is located on said anti-reflection coating. The optical fibre is situated so that the core 45 of the fibre is located so that it overlays one quantum dot. Thus, only the emission from this single quantum dot 47 is collected by the fibre. The core of the single mode optical fibre 29 is designed for a wavelength of 1.3 µm having a diameter of a few microns.

Therefore, to ensure collection of the emission from a single quantum dot, the area density of the dots should be less than ~2×10$^7$ cm$^{-2}$. Optical fibre 29 also has a relatively high numerical aperture so as to collect as much of the emitted light as possible. The anti-reflection coating 43 serves to increase the coupling efficiency between optical fibre 29 and photon source 21.

Figure 4:
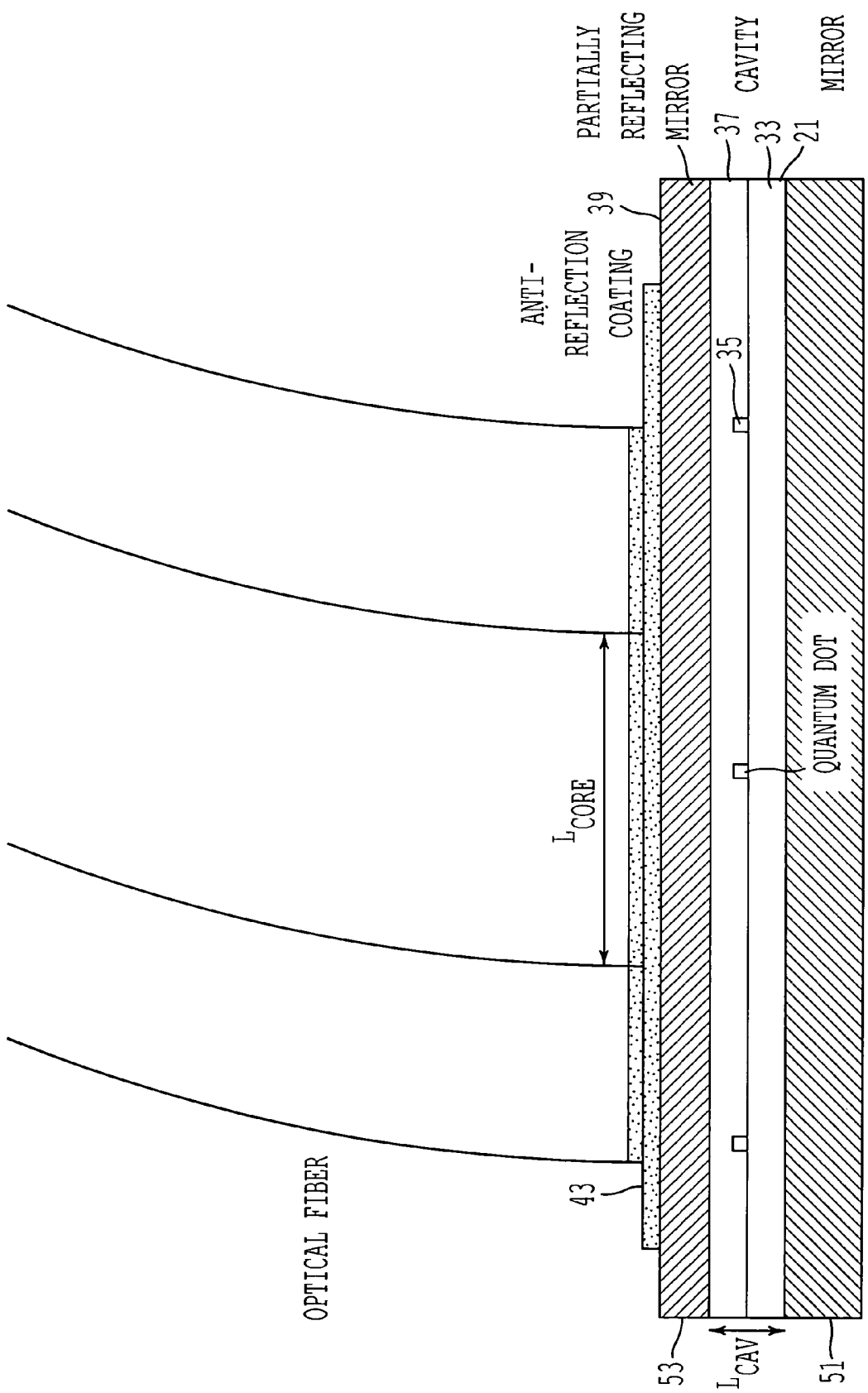
FIG. 4 shows a single photon emitter in accordance with an embodiment of the present invention located within a resonant cavity.

FIG. 4 shows a variation on the single photon source of FIG. 3. Here, the source 21 has an optical cavity. A dot layer 35 is formed overlying the upper surface of under layer 33. Over layer 37 is then formed overlying the quantum dot layer 35. The under layer, quantum dot layer and over layer are located within a resonant cavity. The resonant cavity comprises a lower mirror located at the lower surface of said under layer 21 and an upper mirror 53 located on an upper surface of said over layer 37. The anti-reflection coating 43 is then provided on the output surface 39 which is now the upper surface of the upper mirror 53.

The upper mirror is partially reflecting so that it can let light escape the resonant cavity formed between the upper mirror 53 and the lower mirror 51. This arrangement functions to modify the angle of distribution of light emitted by the photon source 21 and thus, couple more of the emission into the optical fibre 29.

The optical cavity also strongly influences the spontaneous emission process. Upper 53 and lower 51 mirrors inhibit the escape of light from the top and bottom of the cavity. However, light with a wavelength λ which satisfies the condition $$L_{cav} = \frac{m\lambda}{2n_{cav}}$$

where m is an integer, $n_{cav}$ is the refractive index of the cavity and $L_{cav}$, the width of the cavity, is able to escape the cavity. These wavelengths are often referred to as the 'cavity mode'. The cavity strongly modifies the angular dispersion of the emitted light with the cavity mode emitted into a cone centered normal to the plane of the mirrors 51, 53. To achieve maximum coupling efficiency into the optical fibre, the thickness of the cavity is designed to be resonant with a wavelength of the emitting dot. For maximum coupling, the quantum dot is placed at an anti-node of the standing wave pattern between the two mirrors 51, 53.

Figure 5:
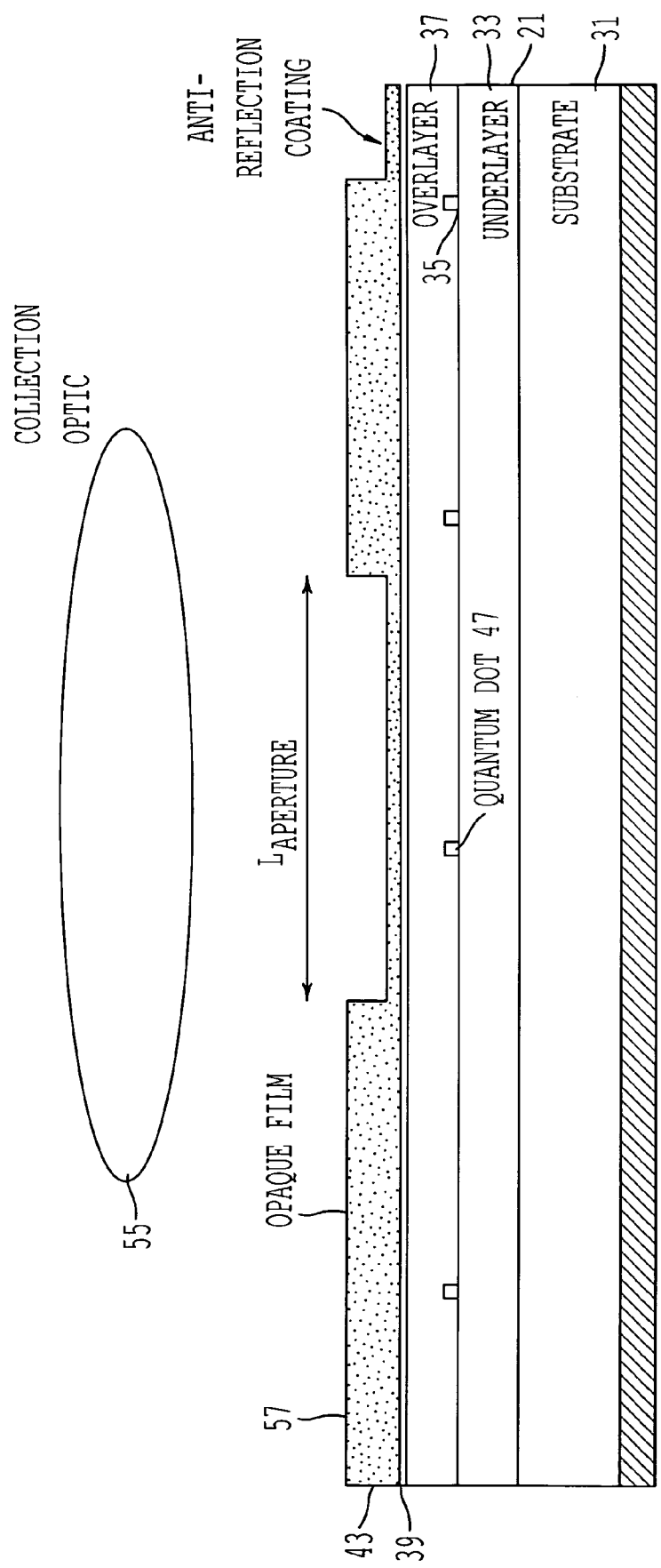
FIG. 5 shows a single photon emitter according an embodiment of the present invention coupled to a collection lens.

In FIG. 5, the emitted photons are collected by lens 55. The structure of the photon source 21 is identical to that described with reference to FIG. 3. Therefore, to avoid unnecessary repetition like reference numerals have been used to describe like features. To ensue that only the light from a single quantum dot 47 is collected by lens 55, the upper surface of the anti-reflective coating 43 has been covered by an opaque film 57. An aperture with a diameter 'L' of between 0.05 and 5 microns has been formed in the opaque film above quantum dot 47 to allow transmission of photons from this quantum dot 47 to the lens 55.

Figure 6:
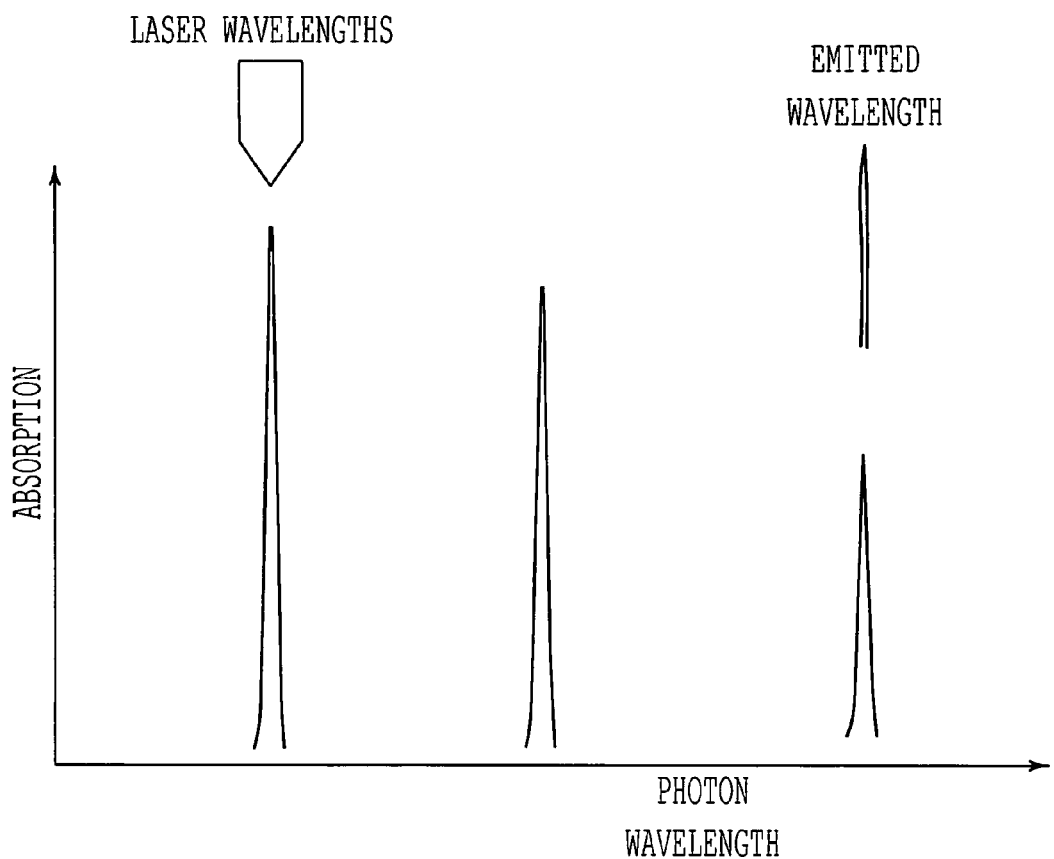
FIG. 6 shows an absorption spectra for a single photon emitter in accordance with an embodiment of the present invention.

A schematic absorption spectrum of a quantum dot 47 is shown in FIG. 6. Absorption is plotted along the Y axis (arbitrary units) and photon wavelength is plotted along the X axis (arbitrary units). The input laser beam is tuned to a transition energy of the quantum dot. The transition energy may be the lowest energy, ground state transition of the quantum dot or, it might be a transition involving excited electron or hole states. The transition energy may be to excite an electron into the conduction band or, it might be to excite an electron from one energy state in the conduction band to an excited energy state in the conduction band. FIG. 6 shows the case where the input beam is tuned to an excited transition, (i.e. not the lowest energy transition) of the quantum dot, creating electrons and holes in the excited levels of the dots. In this case, stray excitation light can be removed by spectral filtering.

The excited electrons and/or holes relax into the ground state levels of the quantum dot and recombine, thereby emitting light at the band-gap wavelength of the quantum dot.

The low degeneracy of the quantum dot levels means that only two electrons and two holes can be resonantly photo-excited in the dot at any one time. If the time for which the dot is excited is much shorter than the relaxation time for electrons and holes in this level, then the dot can only absorb two electrons and two holes per laser pulse. Subsequent recombination will lead to the emission of two photons per laser pulse.

The absorption of a first electron-hole pair by a quantum dot, results in a small shift of the quantum dot transition energy due to the Coulomb interaction. This shift can be larger than the spectral linewidth of the exciting laser, thus preventing the absorption of a second electron-hole pair. In this case the quantum dot will absorb only one electron-hole pair per laser pulse, resulting in single photon emission from the dot.

It is also possible to limit the absorption of the dot to just one electron and one hole by polarizing the exciting light. A circularly polarized laser will excite just one of the electron spin states, and one of the hole spin states. If the time for which the dot is excited is also shorter than time for either the electron or the hole to scatter to its other spin state, then the dot can absorb only one electron and one hole per laser pulse. In this case there will be one photon emitted per excitation pulse of the laser.

It is possible to limit the emission from each quantum dot to single photons by filtering the polarization of the emitted light, for example, using the polarization splitter 31.

Some of the quantum dot transition energy lie very close in energy, allowing the excitation of two or more transitions at the same time. This can be used to generate N photons per laser excitation pulse. Another way to excite more than one transition per cycle is to use several excitation wavelengths.

The discrete energy spectrum of a quantum dot results in a relatively long lifetime for carriers in a particular level (i.e. relaxation time), because there are only a limited number of states into which the carrier can scatter. For instance, for an excited level in the quantum dot, the relaxation time to lower levels has been observed to be 10–100 ps. The exciting laser pulse should be much narrower than the relaxation time, for instance the pulse could be 1 ps wide, in order to avoid relaxation of the electron-hole pair excited in the dot followed by absorption of a second electron-hole pair. The lifetime of a carrier in a particular spin state has also been measured to be relatively long in a quantum dot.

It is also possible to tune the laser wavelength to be resonant with the bandgap transition of the quantum dot. In this case the exciting laser pulse must be shorter than the lifetime of the carriers in the ground state which is typically longer than that of the excited sates and around 100 ps–1 ns. It is important to avoid collecting the exciting laser light by the fibre by using a non-colinear geometry for excitation and collection.

The maximum repetition rate of the laser (or equivalently minimum period) is limited by the time it takes the photo-excited electron and hole to recombine. Since this is typically 100 ps–1 ns, the maximum repetition rate is around 1–10 GHz. In practice one might want to use a lower repetition rate than this.

Figure 7:
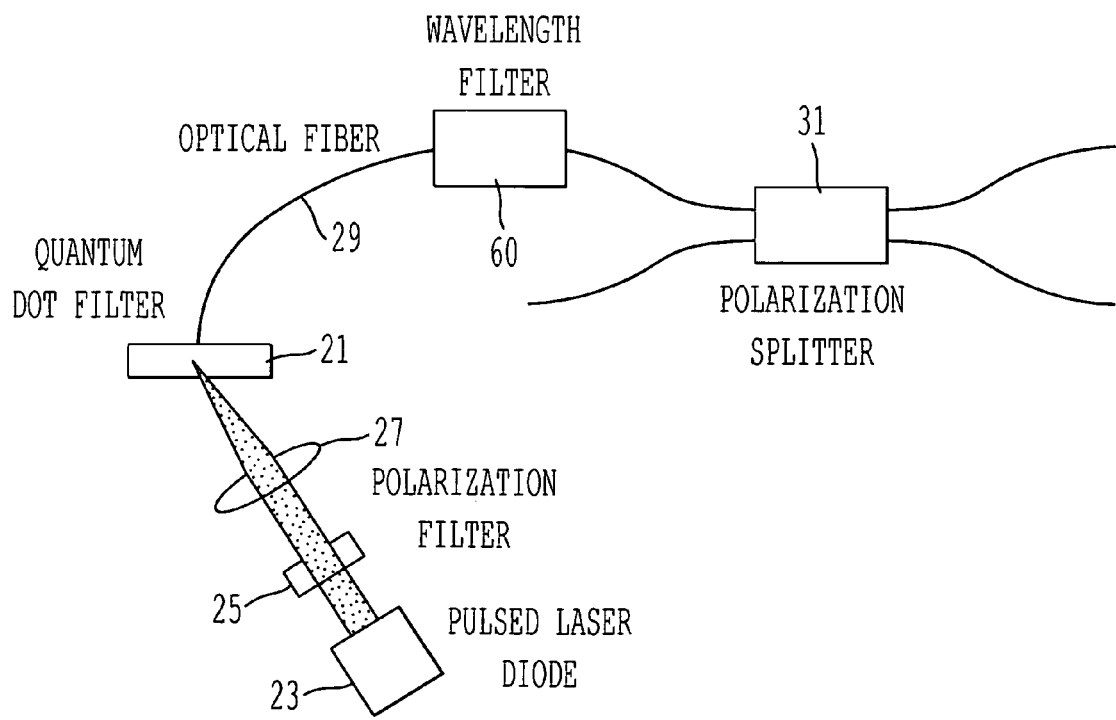
FIG. 7 shows a multiple quantum dot single photon emitter in accordance with an embodiment of the present invention.

FIG. 7 shows an arrangement for collecting single photons emitted from the single photon source 21. The source has a plurality of quantum dots. In such a source, each of the quantum dots will probably have slightly different transition energies due to variations in size between the dots. Therefore, although in this particular arrangement, many of the dots will emit single photons, each of the dots will emit photons at different energies. It is possible to select photons of a particular energy (i.e. from quantum dots) by using wavelength filter 60. Therefore, optical fibre 29 collects photons of all energies from single photon source 21 and feeds it into wavelength filter 60. The filter signal is then fed into polarization splitter 31 as described with reference to FIG. 2. The arrangement of the pulsar diode 23, the polarization filter 25 and the lens 27 are identical to those described with reference to FIG. 2.

Figure 8:
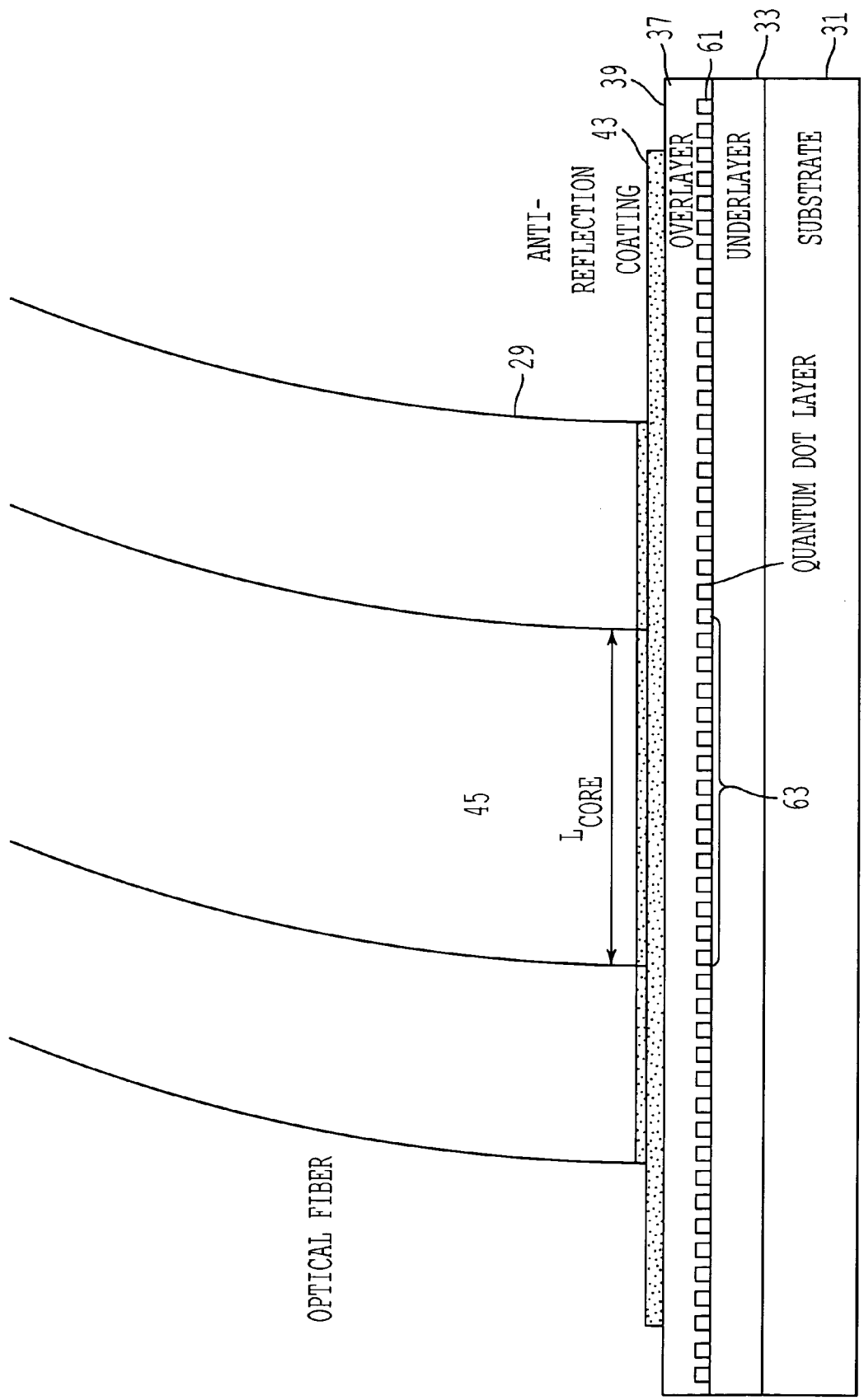
FIG. 8 shows the single photon emitter of FIG. 7 coupled to an optical fibre.

FIG. 8 shows a photon source where photons emitted from a plurality of quantum dots 63. Except for the density of the quantum dot layer the structure is similar to that of FIG. 3. Therefore, to avoid unnecessary repetition like features are denoted by the same reference numerals. In the multiple quantum dot device, a quantum dot layer which has a higher areal density of dots is formed on an upper surface of the underlayer 33. The overlayer 37 is formed overlying the quantum dot layer 61.

In this type of structure, the emission from a large number of quantum dots (1 to 1000) can be collected. However, in this case, it is possible to extract the emission from a single quantum dot by spectrally filtering the emitted light.

In FIG. 8, the core of the optical fibre 29 overlies a plurality of quantum dots 63.

Figure 9:
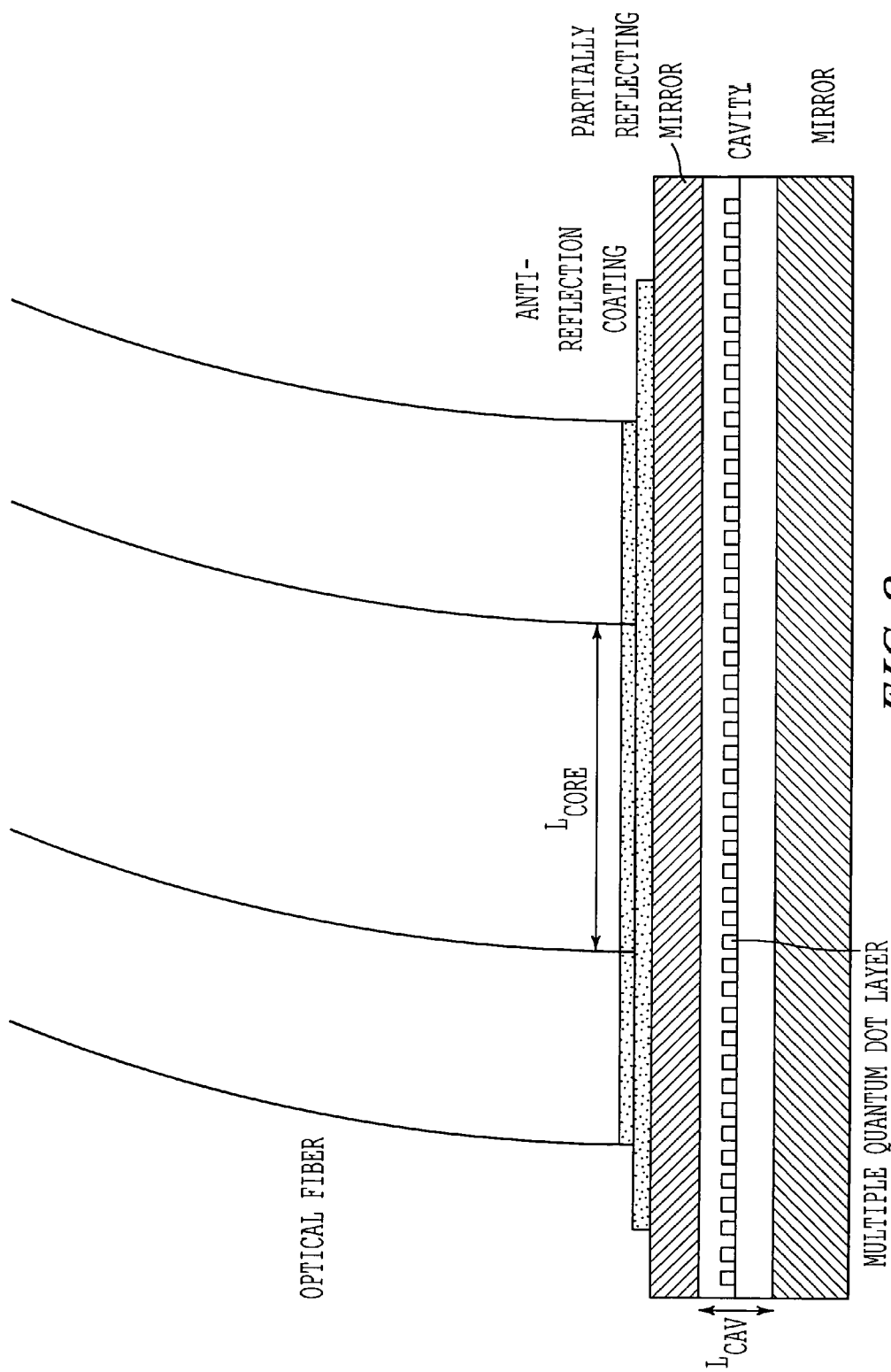
FIG. 9 shows the single photon emitter of FIG. 7 provided within a resonant cavity.

FIG. 9 shows a variation on the multiple quantum dot structure of FIG. 8. Here, the underlayer 33, the dot layer 61 and the overlayer 37 are located within a cavity structure identical to the type described with reference to FIG. 4. To avoid unnecessary repetition, like features are denoted with the same numerals.

Another advantage of the resonant cavity is that it will also act as a wavelength filter. This is because the resonance condition $$\left( L_{cav} = \frac{m\lambda_{cav}}{2n_{cav}} \right)$$

is only satisfied for a narrow range of emission wavelengths. Thus, only these wavelengths are emitted into a narrow cone normal to the mirror 51, 52 as described with reference to FIG. 4. The bandpass which can be though of arising from the lifetime of the photon in the cavity, is largely determined by the reflectivity of the mirror 51, 53. Thus, increasing the reflectivities of the mirrors 51, 53 leads to a sharper cavity mode. The spectral bandpass of the cavity (or in other words, the width of the cavity mode) should ideally be designed to be roughly equal to the spectral width of the emitting quantum dot.

Figure 10:
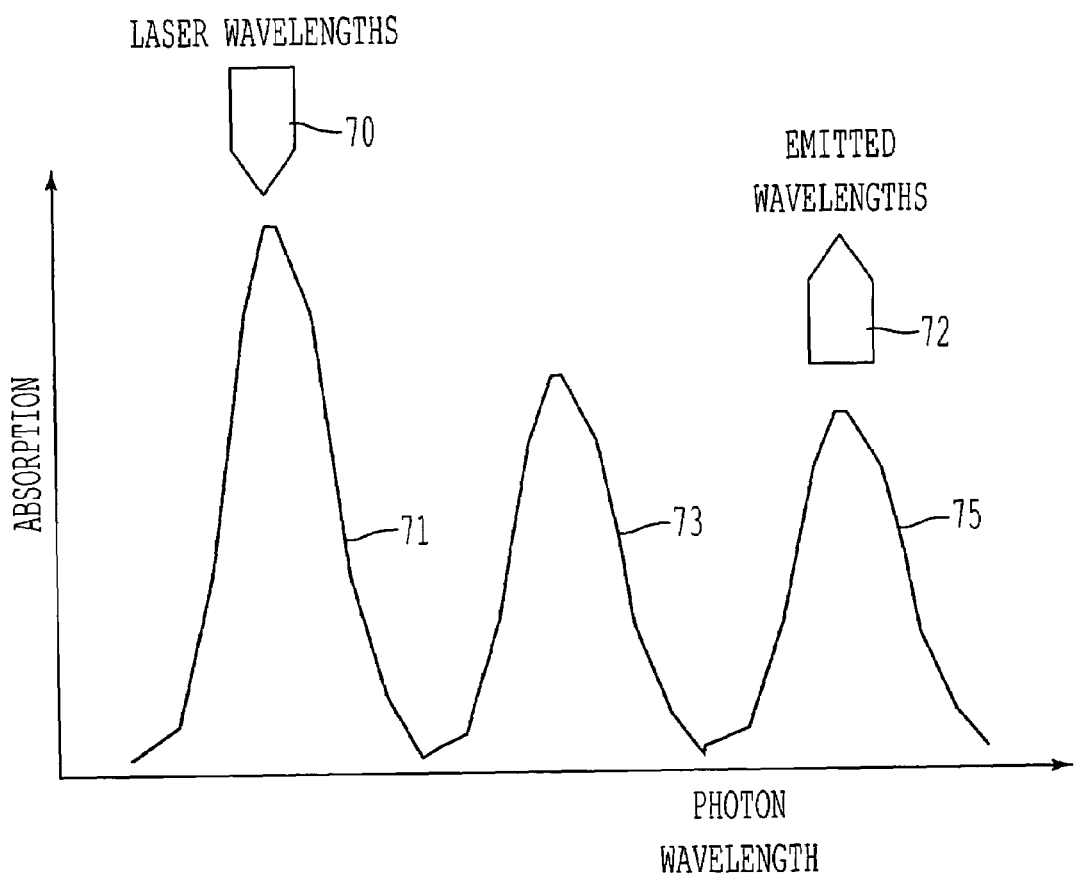
FIG. 10 shows a schematic absorption spectra of the embodiment of FIG. 7.

FIG. 10 shows a schematic optical absorption spectrum of the plurality of quantum dots 63 shown in FIGS. 8 and 9. Absorption of the quantum dot is plotted along the y-axis (arbitrary units) photon wavelength of the emitted photons are plotted along the x-axis (arbitrary units). The optical spectrum of each quantum dot consists of a series of sharp lines whose width are determined by the homogenous broadening due to the finite lifetime. However, because of unavoidable fluctuations in the size and composition of the dots in a plurality of dots, the transition energies vary from dot to dot. Thus, the three absorption peaks 71, 73, and 75 are in homogenously broadened.

Figure 11B:
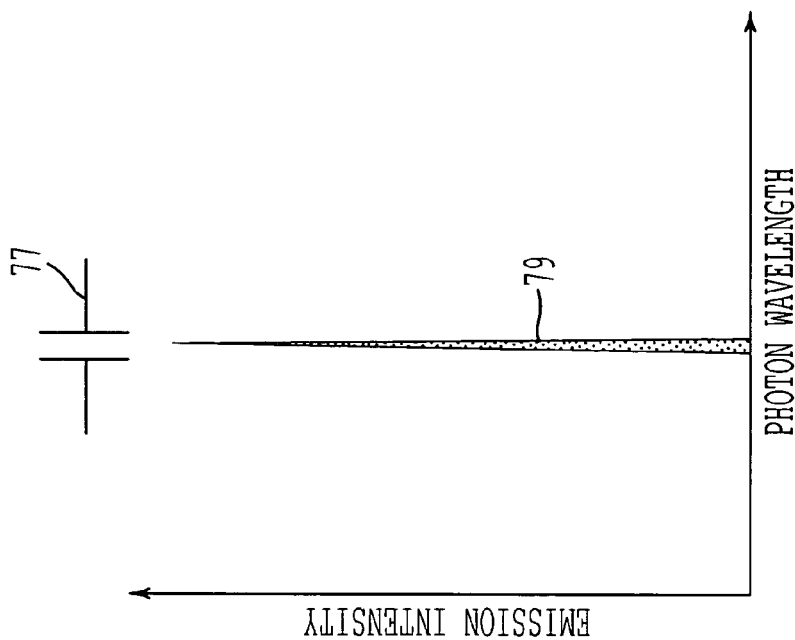
FIG. 11 shows schematic plots to illustrate filtering of the wavelength of the embodiment of FIG. 7.
Figure 11A:
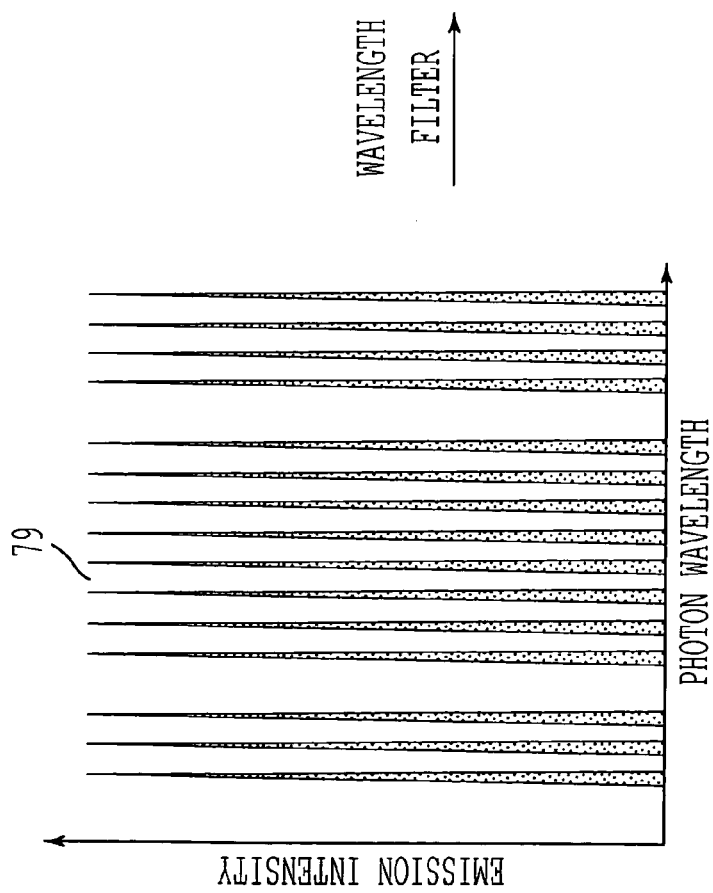

If the quantum dots 63 are excited by a laser with a broad wavelength spectrum, a large number of quantum dots will be expected in the active region. However, because each of these emits a different wavelength, it is possible to filter the collected light in order to see the emission from a single dot. This is shown schematically in FIGS. 11a and 11b. FIG. 11b shows a plot of emission intensity on the y-axis (arbitrary units) and photon wavelength on the x-axis (arbitrary units). Each of the plurality of spikes is due to emission from a particular transition within a single quantum dot FIG. 11b shows the results where filter 77 has filtered all but one of the photon wavelengths 79. Therefore, using pulsed excitation, it is possible to generate period emission of a single or multiple photons from a dot in a similar way to that described above. Preferably, the emitting area of the sample from which light is collected should contain a limited (<1000) number of optically active quantum dots.

Figure 12:
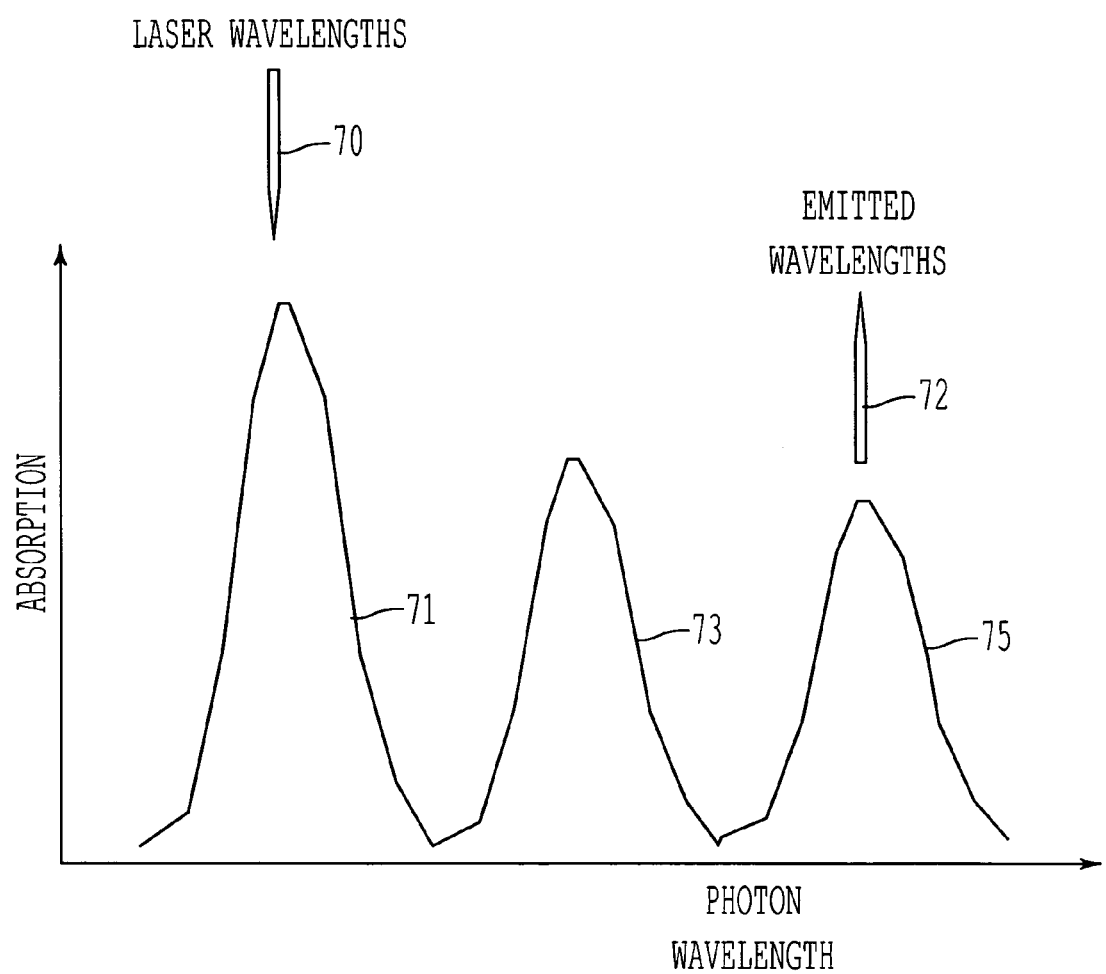
FIG. 12 shows an absorption spectra for the embodiment of FIG. 7 with filtration.

Alternatively, a spectrally narrow laser may be used to excite a transition in just or a few quantum dots. Such a configuration is illustrated with reference to FIG. 12. FIG. 12 shows an optical absorption spectrum similar to that of FIG. 10. Peaks 71, 73 and 75 are due to excitation of different quantum dot transitions. The incident laser wavelength 70 is much narrower here than the laser wavelength described with reference to FIG. 10. Hence, the laser excites only a fraction of the quantum dot plurality: those with a transition energy equal to the laser energy. Hence, it can be seen that the emitted wavelength 72 is also much narrower than the emitted wavelength (before filtering) of the spectrum shown in FIG. 10. A laser of sufficiently narrow wavelength spectrum will excite just one of the quantum dots. Preferably, the emitting area of the sample from which light is collected should contain a limited (<1000) number of optically active quantum dots.

Figure 13:
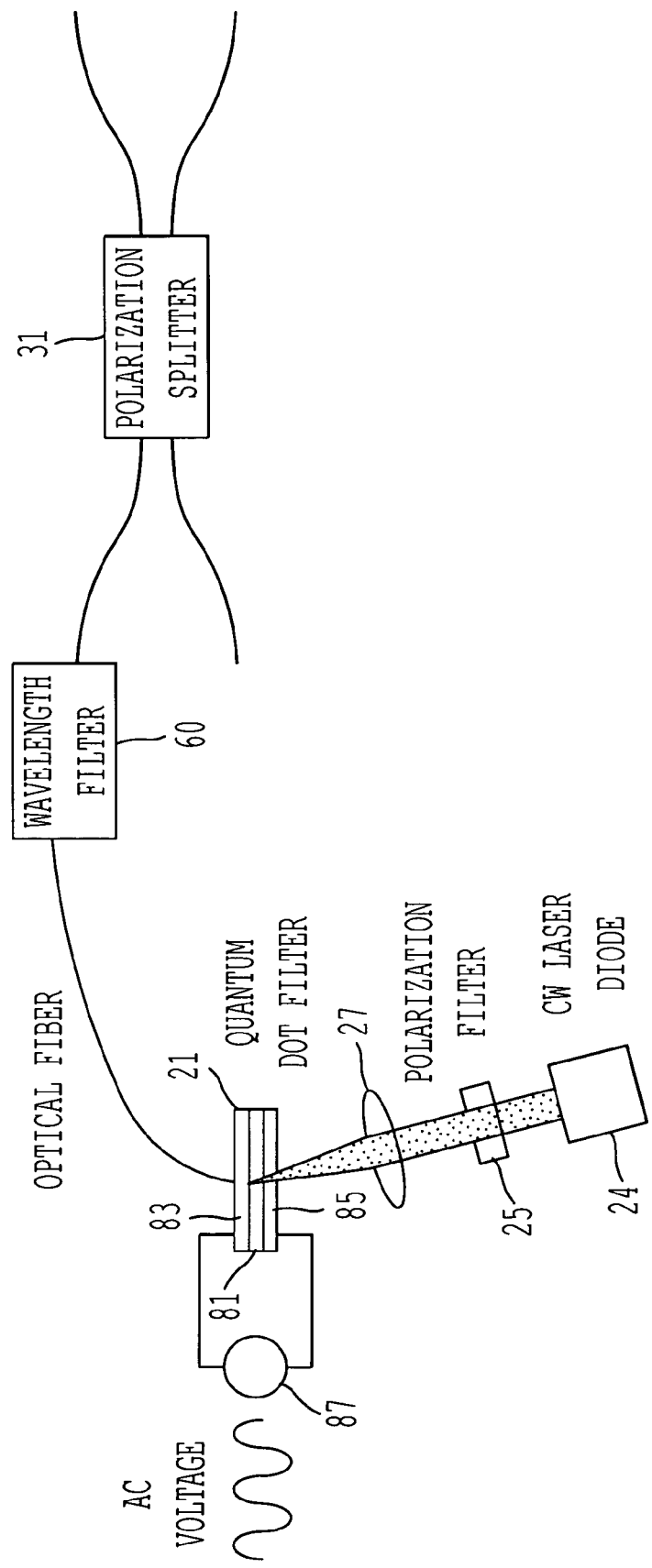
FIG. 13 shows an electrically triggered single photon source in accordance with an embodiment of the present invention.

FIG. 13 shows an electrically triggered quantum dot filter. The single photon source 21 is illuminated by a CW (continuous wave) laser with a narrow spectral line width 24. The CW laser 24 provides, as the name suggests, a continuous intensity and does not emit a pulsed signal. The wavelength of the CW laser is tuned to an optical transition energy of the quantum dot. The output from the CW laser is passed through a polarization filter 25 and focused by lens 27 onto single photon source 21 as previously described with reference to FIG. 2.

The single photon source 21 has an active region 81 which comprises a layer of quantum dots. These dots may be spatially distributed so that is possible to obtain emission from a single dot as described with reference to FIGS. 3 and 4, or they may be more densely packed so that a plurality of dots emit photons as described with reference to FIGS. 8 and 9. The quantum dot layer 81 is interposed between a top contact 83 and a bottom contact 85. The top and bottom contact 83 and 85 will typically be a p-contact and a n-contact. An AC voltage source 87 is then connected to top contact 83 and bottom contact 85 such that on application of an AC voltage, the field across the quantum dot layer 81 is varied. This periodic modulation varies the transition energies of the quantum dot.

The CW laser 24 is tuned to an optical transition of the quantum dot. It can be tuned to an excited transition or the ground state transition energy. The applied periodic modulation varies the transition energy of the dots. Therefore, the input radiation is only capable of exciting an electron or a hole into the relevant levels at a certain applied potentials to electrodes 83, 85. Hence, the period modulation of the voltage applied to electrodes 83 and 85 is equivalent to pulsing the laser radiation.

The applied periodic modulation should modulate the energies for quantum dot transition which is close to the resonance with the lase. Photon absorption can occur at times when quantum dot transition energy equals that of the laser, which occurs twice per period of the modulation. Subsequent recombination results in emission of photons. Photons are thereby emitted at time intervals determined by half the period of the applied modulation. For a stream of single photons at regular time intervals, it is important that the half period of the modulation be longer than the recombination time of the electron hole pair.

Figure 14:
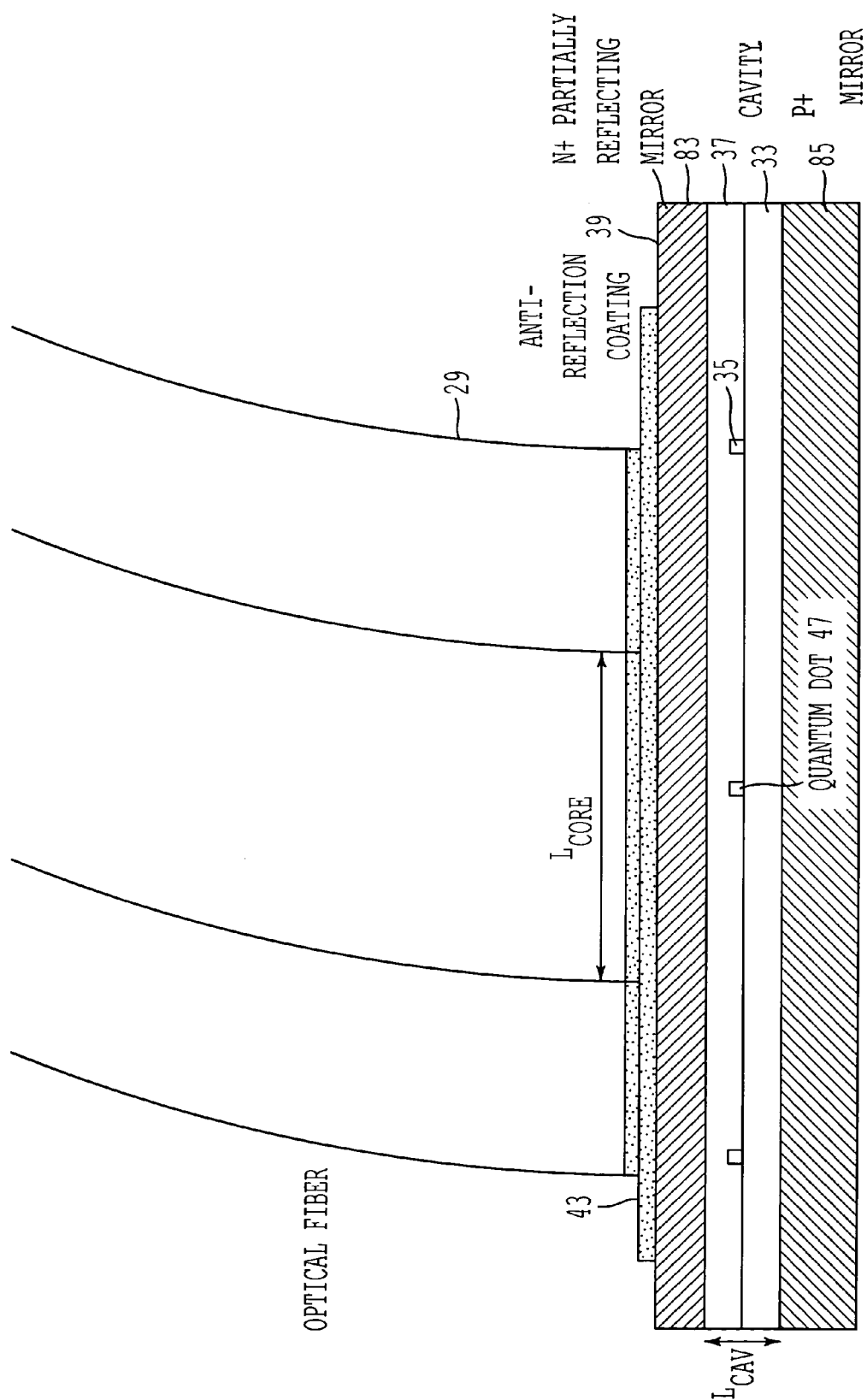
FIG. 14 shows the embodiment of FIG. 13 coupled to an optical fibre.

FIG. 14 shows the single photon emitter 21 arranged in a resonant cavity of a type described with reference to FIGS. 4 and 9. To avoid unnecessary repetition, the underlayer 33, the quantum dot layer 35 and the overlayer 37 are identical to those described with reference to FIG. 3. Also, the antireflection coating 43 and the optical fibre cable 29 are also identical described with reference to FIG. 3.

The lower contact, which is a p$^+$ region acts as the lower minor 51 of FIG. 4. Upper contact 83 which is n$^+$ also functions is a partially reflecting mirror and are similar to minor region 53 in FIG. 4. The contact regions 85 and 83 which act as mirrors form a resonant cavity which has the same advantages as described with reference to FIG. 4 and FIG. 9.

Varying the applied voltage to the top contact 83 and the lower contact 85 varies the electric field across the quantum dot 47 due to the Stark-effect. The Stark-effect shifts the transition energies of the quantum dot. Other types of modulation can also be used such as periodic variations in the carrier density of the quantum dot or the carrier density of a surrounding layer or applied magnetic field, temperature, etc.

Figure 15:
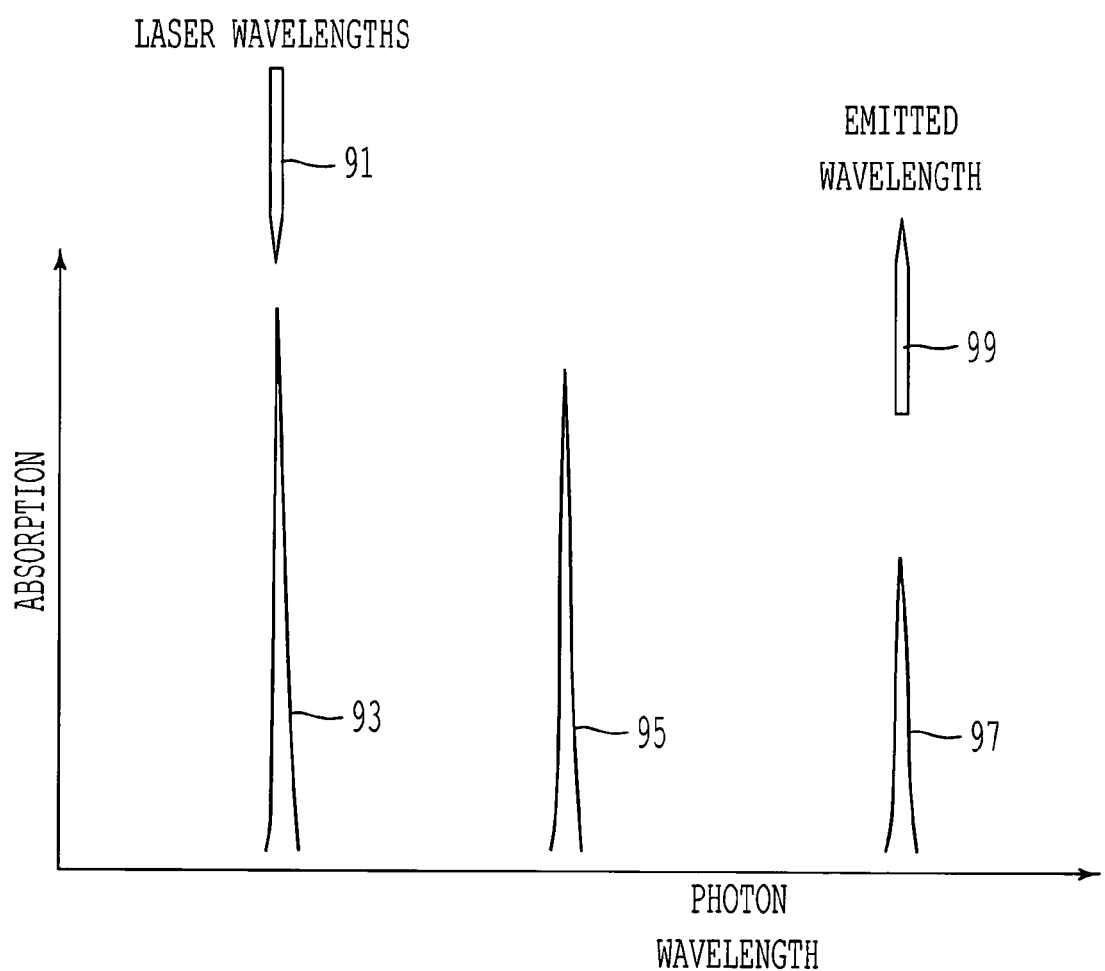
FIG. 15 shows an absorption spectra for the embodiment of FIG. 13.

FIG. 15 shows an absorption spectra of a single photon detected described with reference to FIGS. 13 and 14. Absorption is plotted on the y-axis (arbitrary units). Photon wavelength is plotted on the x-axis (arbitrary it). The laser wavelength 91 is narrow and excites absorption at photon wavelengths 93, 95 and 97. Photons are emitted 99 at wavelength 97.

FIG. 16 illustrates the relationship between single photon emission and applied AC perturbation in the device of FIGS. 13 and 14. In FIG. 16a, applied AC perturbation on the y-axis (arbitrary units) is plotted against time on the x-axis (arbitrary units). In FIG. 16b, the quantum dot transition wavelength (related to the quantum dot transition energy by $E=hc/\lambda$) is plotted on the y-axis and the elapsed time is plotted against the x-axis (arbitrary units). The time axis in both FIGS. 16a and 16b are identical. It can be seen that a quantum dot transition wavelength vanes periodically with that of the applied AC perturbation. The laser wavelength in this case (that is the applied radiation) is tuned to the transition energy of the quantum dot transition in the absence of any modulation. Photon absorption occurs at the times that the quantum dot transition energy equals that of the laser which occurs twice per period of the modulation. Subsequent recombination results in the emission of a photon. Photons are thereby emitted at time intervals determined by half the period of the applied modulation. For a regular stream of single photons it is important that the half period of the modulation be longer than the recombination time of the electron and hole.

Figure 17:
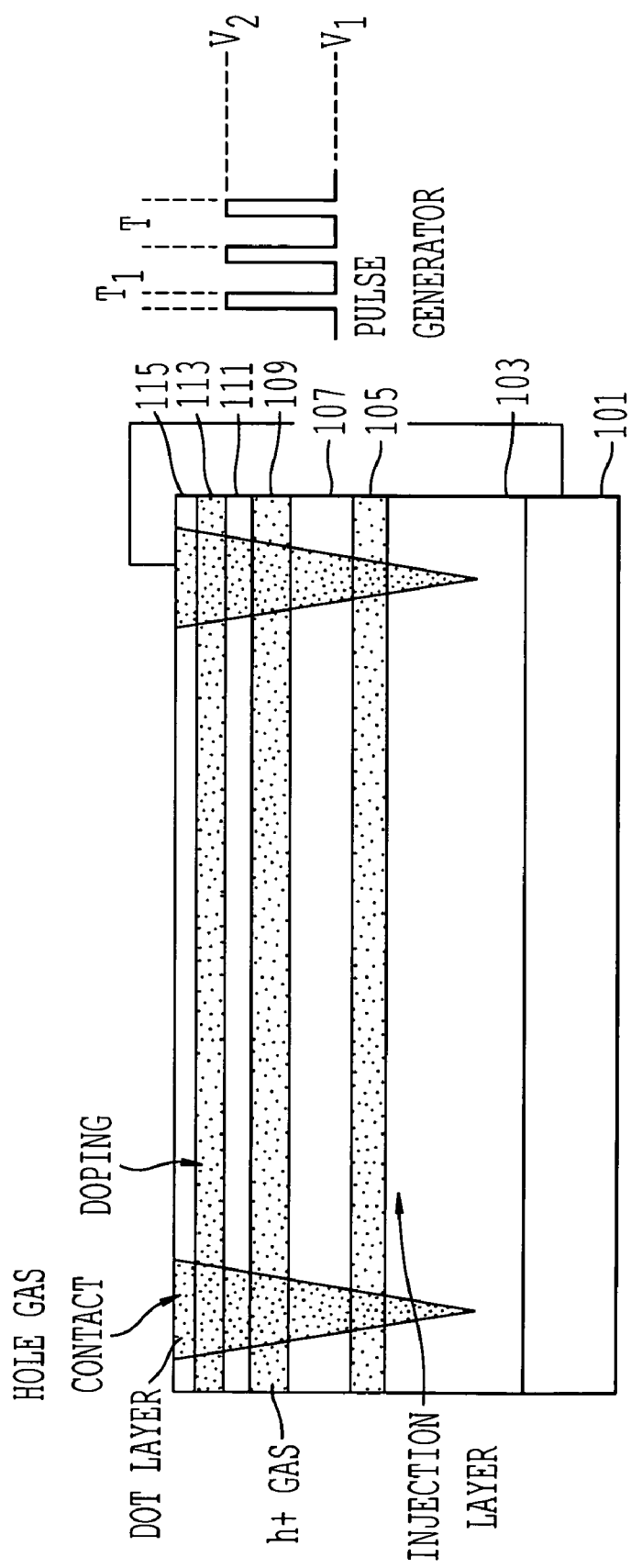
FIG. 17 shows and electrically injected quantum dot single photon emitter.

The single photon emitter does not require excitation by illuminations. It is possible to introduce the electrons and the holes into the compliant energy levels for recombination by applied voltage. FIG. 17 shows such an electrically operable device. The device comprises a buffer layer 103 formed overlying an upper surface of an injection gate 101. The buffer layer separates the injection gate 101 from an injection layer 105. Electrons can be induced in to injection layer 105. A tunnel layer 107 is formed overlying an upper surface of injection layer 105. A quantum dot layer 109 is then formed overlying an upper surface of tunnel barrier 107. A p-type dopes barrier layer 113 is formed overlying an upper surface of an n-doped spacer layer 111 such that barrier layer 113 separated from the quantum dot layer 109 via spacer layer 111. The structure is finished with a cap layer 115 which overlies an upper surface of the doped barrier layer 113. Contacts are made to the dot layer 109 and the injection gate 101 such that the injection gate 101 can be bias with respect to dot layer 109. In operation, the device is configured so that doped bier layer 113 supplies holes to dot layer 109 so that the quantum dots are always populated by holes. Injection gate 101 can be biased with respect to dot layer 109 such that electrons are induced in injection layer 105. Electrons can be injected into the quantum dot layer 109 due to resonant tunneling through tunnel barrier 107 by varying the bias between the injection gate and the hold house.

The injection of electrons into the dot layer 109 is regulated by applying a periodic voltage between the dot layer 109 and the injection gate 101.

Figure 18:
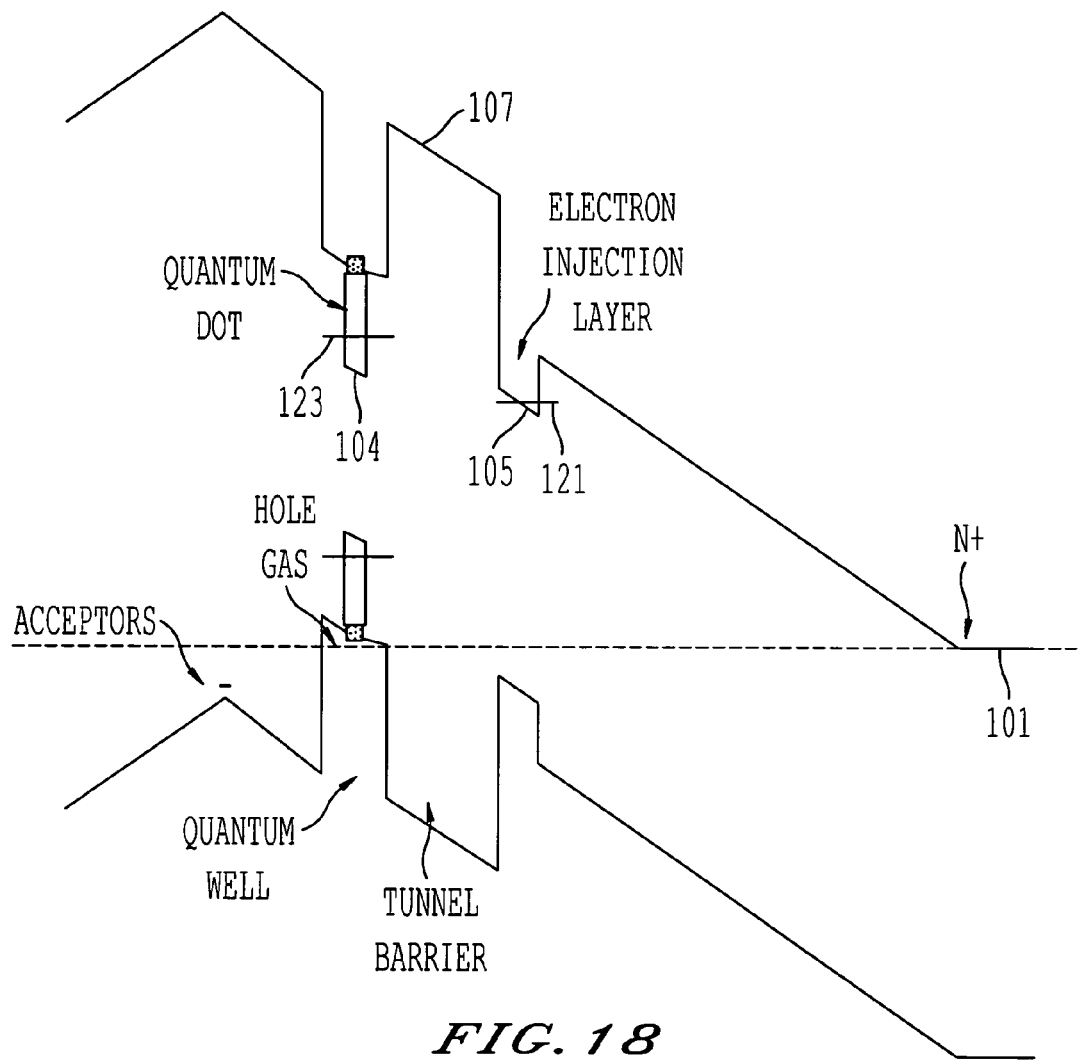
FIG. 18 shows a band structure of the device of FIG. 17 when in an OFF condition.

The bias consists of a periodic steam of pulses between two levels $V_{on}$ and $V_{off}$. The voltage level $V_{off}$ is chosen so that the electron energy level in the injection level is lower than that in the quantum dot. This is shown in FIG. 18. For clarity, the layers in FIG. 18 have kept the same reference numerals as those in FIG. 17.

The electrons in the electron injection layer 105 have an energy 121. In order to resonantly tunnel through barrier 107 into quantum dot layer 109, the electrons must have an energy equal to that of level 123 shown in the quantum dot. In the $V_{off}$ state, the electrons do not have this energy. Therefore, no tunnelling can take place and hence, no recombination of electrons with holes in the dot can occur.

Figure 19:
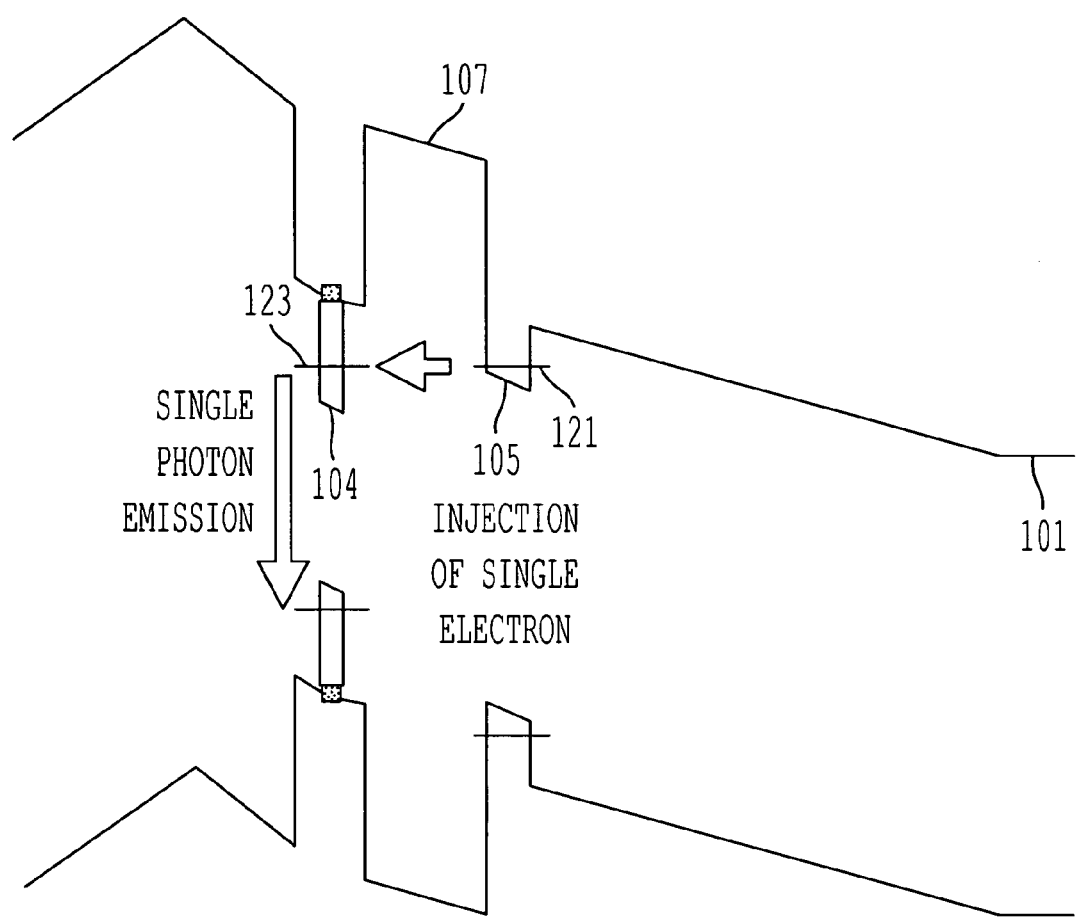
FIG. 19 shows a band structure of the device of FIG. 17 when in an ON condition.

FIG. 19, shows the state where the potential of the injection gate 101 is raised to $V_{on}$. Under these conditions, the band structure of the device changes so that energy level 121 in the electron injection layer 105 aligns with energy level 123 of the quantum dot and resonant tunnelling of a single electron can occur from injection layer 105 through tunnel layer 107 into quantum dot layer 109. Thus, recombination can occur and a photon can be emitted. It is clear, that as the tunneling is controlled by switching the potential between $V_{on}$ and $V_{off}$, the control of single photons can be achieved.

The electrically-pumped device can be arranged inside a resonant cavity in a similar manner to the optically pumped devices described above.

Figure 20:
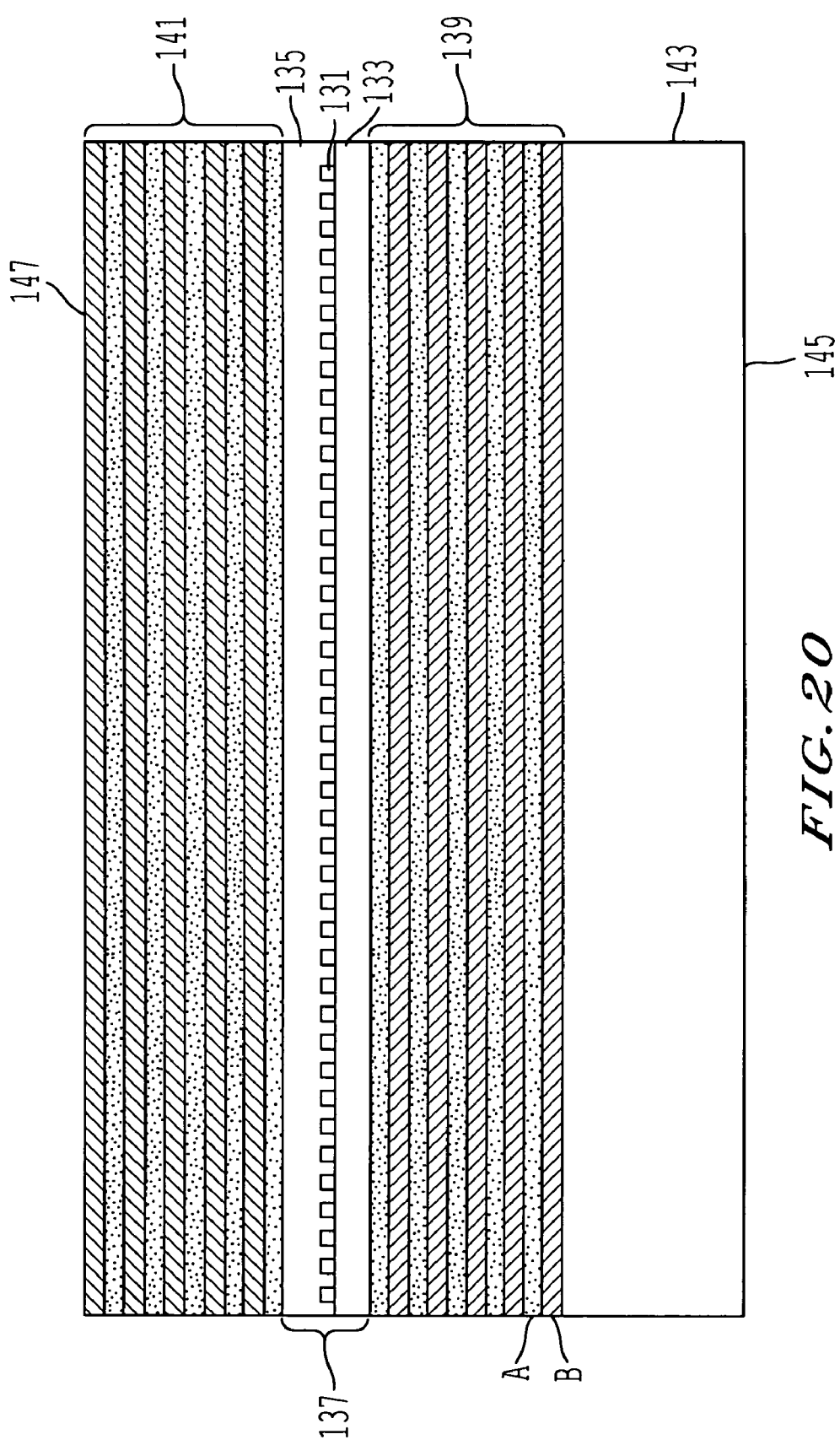
FIG. 20 shows in detail a structure of a single photon source according to an embodiment of the invention located within a resonant cavity.

FIG. 20 shows in detail a quantum dot emitter which is designed for emission at a wavelength of ($\lambda$) 1.3 μm which is suitable for long distance fibre optic transmissions.

The quantum dot layer 131 is sandwiched between an under layer 133 and an over layer 135. This groups of three layers (quantum dot layer, over layer and under layer) are in turn interposed between a resonant cavity structure such that light can be reflected within the cavity 137 which contains the said layers. The thickness of the cavity $L_{cav}$ should be approximately given by the equation.

$$L_{cav} = \frac{m\lambda}{2n_{cav}}$$

where m is an integer and $n_{cav}$ is the average refractive index of the cavity. For a GaAs cavity, $\lambda$ at 1.3 μm this leads to a cavity thickness $L_{cav}$ of 190.9 nm for a $\lambda/2$ cavity (i.e. m=1). The quantum dot layer 131 is positioned so as to lie at the antinode of the cavity mode. In this example, the antinode of the cavity lies close to the centre of the cavity. Possibly, there may be more than one quantum dot layer within the cavity and positioned close to an antinode of the cavity mode.

To determine the cavity 137, layers 133 and 135 are imposed between Bragg mirrors 139 and 141. Each Bragg mirror 139, 141 comprises N (where N is an integer) repeats of two dielectric layers A and B. Dielectric layer A as a refractive index of $n_a$ and a thickness of $t_a$. Dielectric layer B has a refractive index of $n_b$ and a thickness of $t_b$. In FIG. 20, each mirror comprises five periods of layers A and B. However, it should be noted that the two layers do not need to have the same number of layers. In order to form a Bragg mirror, the thickness of layers A and B are chosen so that $n_a t_a = n_b t_b = \lambda/4$. In this example the mirror is formed from alternating layer of AlAs ($n_a$=2.927, $t_a$=111.04 mm) and GaAs ($n_b$=3.405, $t_b$=95.46 nm). The number (=N) of repeats of layers A and B is chosen so as to obtain a suitable spectral bandpass for the cavity and should be sufficiently thick to effectively couple the cavity mode into the numerical aperture of the optical fibre or cavity mode. In practice N should be chosen to be between 3 and 50.

Such a structure, using semiconductor Bragg mirrors, may conveniently be formed by epitaxial growth techniques such as MBE or MOCVD. For instance, a structure with AlAs/GaAs mirrors and InAs quantum dots (described below) may be grown on a GaAs substrate.

The layer structure consists of in sequence a GaAs buffer layer, 143

20 repeats of (GaAs 95.46 nm, AlAs 111.04 nm), to form lower mirror 139

95.46 nm GaAs, to form under layer 133 a layer of quantum dots, 131

95.46 nm GaAs, to form over layer 135

20 repeats of (AlAs 111.04 nm, GaAs 95.46 nm) to form upper mirror 141.

The quantum dot layer can conveniently be formed from a 1.54 monolayer thick layer of InAs, which is known to self-assemble into nano-meter sized islands on the GaAs growth surface during MBE or MOCVD growth. Overgrowth of these islands with GaAs or AlGaAs leads to the formation of a layer of quantum dots. The growth parameters should be optimised to produce quantum dot transitions at the desired wavelength—in this case 1.3 microns. We have found for MBE growth, it is best to grow the quantum dot layer with a substrate temperature of 500–530° C. and with a relatively low Indium flux rate so as to achieve a growth rate for InAs of around 0.01 microns/hour. The areal density of quantum dots can be varied by controlling the thickness of InAs deposited.

This method can also be used to form multiple layers of quantum dots within the cavity, which can be separated by GaAs or AlGaAs barriers.

The structure may be etched using standard photolithography so as to form mesas with a diameter between 0.5 and 500 microns. Preferably the mesa may have a diameter so as to support a single transverse mode inside the cavity. The mesas may be etched into the upper mirror upper mirror and cavity layer. It may also extend into the lower mirror.

The optical fibre or collection optic (29 from FIG. 2) may be placed on the substrate side 145 of the wafer, or alternatively, on the top side 147. Optionally, an area of the substrate 143 may be etched away, so as to allow a more efficient coupling to an optical fibre and convenient mounting of the fibre 29. An etch stop layer may be included in the epitaxial growth, to allow the depth of the substrate etch to be carefully controlled. An anti-reflection coating may be deposited of the collection face to reduce the Fresnel losses.

In this example the bulk of the cavity is made of GaAs 133, 135, however, the cavity could also be formed from an AlGaAs layer. In this case the thickness of the cavity must be adjusted so as to maintain resonance of the cavity mode and the quantum dot, because of the difference in the AlGaAs and GaAs refractive indices.

One or both of the Bragg mirrors 141, 139 can be formed using alternating layers of dielectrics such as $SiO_2$ and $TiO_2$. For the lower mirror the substrate can be etched away before the lower Bragg mirror is deposited. An etch stop layer may be included in the growth structure to allow this.

The previous example was for a device grown upon a GaAs substrate. The emitter can also be prepared upon an InP substrate. The following example describes a device suitable for operation at 1.55 micron, another fibre optic transmission window.

In this example the cavity 133, 135 may be formed mostly from InP, $(In_xGa_{1-x})$As or $(In_yAl_{1-y})$As and the Bragg mirrors from alternating layers of (AlGa)(AsSb) and Al(GaSb), or alternating layers of InP, and (InGa)(AsP), or alternating layers of Ga(PSb) and Al(PSb).

For an $In_{0.52}Al_{0.48}$As cavity, $L_{cav}$ at 1.55 μm can be determined from $n_{cav}$ using the equation $$L_{cav} = \frac{m\lambda}{2n_{cav}}$$

The quantum dot layer (or layers) are positioned so as to lie close to the antinode of the cavity mode. In this example the antinode of the cavity mode lies close to the centre of the cavity. There may be more than one quantum dot layer in the cavity.

In this example, the mirror 139 is formed from alternating layers of $(Al_{0.1}Ga_{0.9})(As_{0.5}Sb_{0.5})$ ($n_a$=3.93, $t_a$=98.6 nm) and $Al(As_{0.5}Sb_{0.5})$ ($_nb$=3.30, $t_b$=117.4 nm). The number (+N) of repeats of layers A and B is chosen so as to obtain a suitable spectral bandpass for the cavity and should be sufficiently thick to effectively couple the cavity mode into the numerical ate of the optical fibre or cavity mode. In practice N should be chosen to be between 3 and 50. The structure may conveniently be formed by epitaxial growth techniques such as MBE or MOCVD. Typical growth temperatures for MBE grown Bragg mirrors are 500° C.

The layer structure consists of
a GaAs buffer layer 145,
20 repeats of $(Al_{0.1}Ga_{0.9})(As_{0.5}Sb_{0.5})$ 98.6 nm, (Al $(As_{0.5}Sb_{0.5})$ 117.4 nm 139;
$In_{0.52}Al_{0.48}As$ 133,
a layer of quantum dots 131,
$In_{0.52}Al_{0.48}AS$ 135,
20 repeats of $Al(As_{0.5}Sb_{0.5})$ 117.4 nm, $(Al_{0.1}Ga_{0.9})(As_{0.5}Sb_{0.5})$ 98.6 nm 141.

The quantum dot layer 131 can conveniently be formed from a 1.5–4 monolayer thick layer of InAs which because of the strain will self-assemble into nanometer sized islands. Overgrowth of these islands to the formation of a layer of quantum dots. The growth parameters should be optimised to produce quantum dot transitions at the desired wavelength—in this case 1.55 microns.

This method can also be used to form multiple layers of quantum dots within the cavity 133, 135, which can be separated by $In_xGa_{1-x}As$ or $In_yAl_{1-y}As$ or InP barriers.

The structure may be etched using standard photolithography so as to form mesas with a diameter between 0.5 and 500 microns. Preferably the mesa may have a diameter so as to support a single transverse mode inside the cavity. The mesas may be etched into the upper mirror and cavity layer. It may also extend into the lower mirror.

The optical fibre or collection optic may be placed on the substrate side 143 of the wafer, or alternatively, on the top side. Optionally, an area of the substrate may be etched away, so as to allow a more efficient coupling to an optical fibre and convenient mounting of the frame. An etch stop layer may be included in the epitaxial growth, to allow the depth of the substrate etch to be carefully controlled. An anti-reflection coating may be deposited of the collection face to reduce the Fresnel losses.

In this example, the bulk of the cavity 133, 135 is made of $In_yAl_{1-y}As$, however, the cavity could also be formed from an $In_xGa_{1-x}As$ or InP. In this case the thickness of the cavity must be adjusted so as to maintain resonance of the cavity mode and the quantum dot, because of the difference in the refractive indices of the different materials.

One or both of the Bragg mirrors 139, 141 can be formed using alternative layers of dielectrics such as $SiO_2$ and $TiO_2$. For the lower mirror the substrate can be etched away before the lower Bragg mirror is deposited. An etch stop layer may be included in the growth structure to allow this. The structure may also be grown with one or more metal mirrors, as described in the examples below.

The structure may also be prepared upon a GaAs substrate 145, by first growing a uniform or compositionally graded layer of (InGa)As or (InGa)(AsSb) on top of the substrate, so as to match to the lattice constant of the epilayers.

Figure 21:
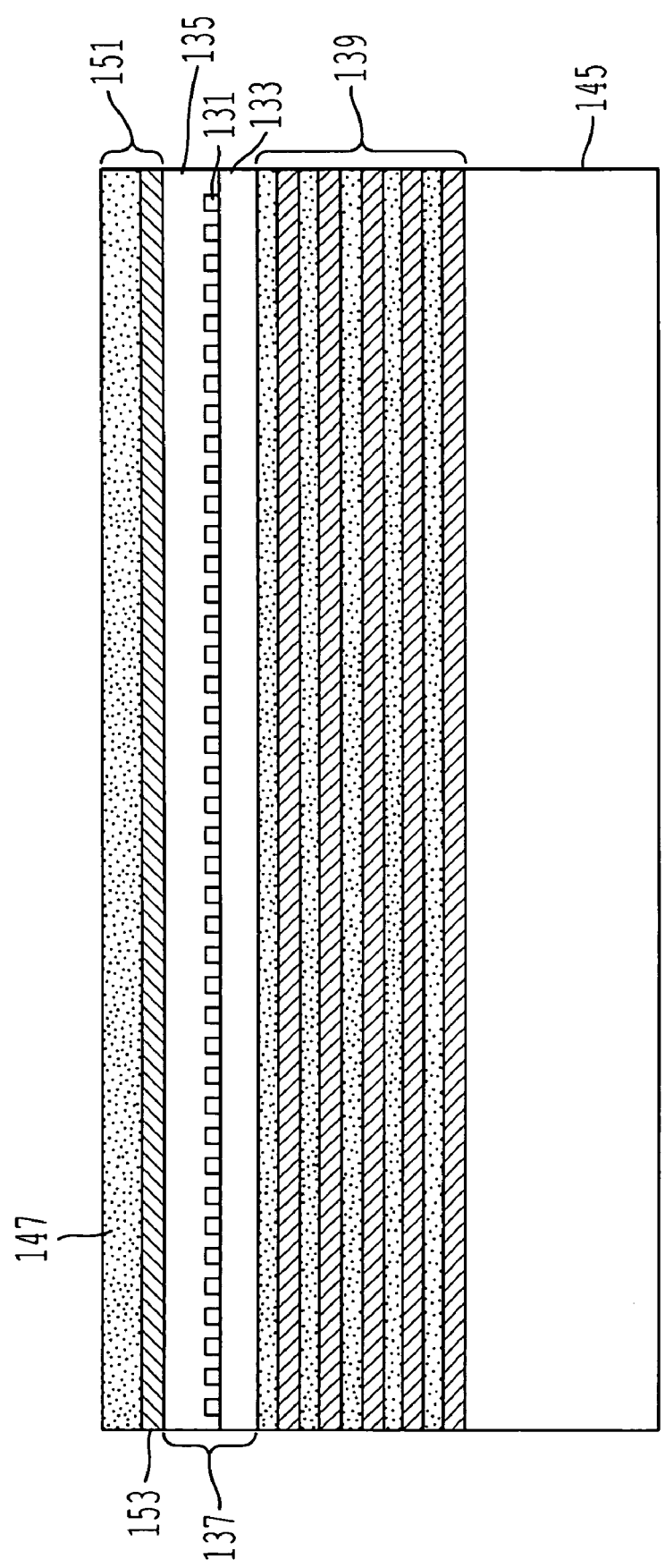
FIG. 21 shows a variation in the resonant cavity of FIG. 20.

FIG. 21 shows a variation of the structure of FIG. 20. Here, one of the mirrors 141 of the cavity has been formed using a metal layer 151. A metal of high reflectivity may be chosen such as gold. The example of a cavity resonant with a wavelength of 1.3 µm is again given. In this case we chose a λ cavity (i.e. m=2) of GaAs, requiring $L_{cav}$~381.84 nm. The cavity could alternatively comprise AlGaAs.

In this example the mirror reflectivities are different and thus the cavity mode is not symmetric about the centre plane of the cavity. This means the antinode of the cavity mode lies away from the centre of the cavity. For maximum coupling the quantum dot layer 131 should be shifted to lie at the antinode of the cavity 137.

The structure includes a so-called phase-matching layer 153 between the cavity 137 and the metal mirror 151, which compensates for the fact that the cavity mode does not have an antinode at the edge of the metal 151. For this cavity, the phase matching layer may be formed from a GaAs layer which is approximately 70 nm thick.

The layers may again be grown by MBE or MOCVD on a GaAs substrate. The layers comprise
a GaAs buffer layer, 143
10 repeats of (GaAs 95.46 nm, AlAs 111.04 nm), 139
193.3 nm GaAs, 133
a layer of quantum dots, 131
188.54 nm GaAs, 135
70 nm GaAs (phase matching layer 153).

The quantum dots are formed in the way described with reference to FIG. 20. A 200 nm gold layer is evaporated on the top surface to act as the top mirror 15.

The structure may be etched using standard photolithography so as to form mesas with a diameter between 0.5 and 500 microns. This can conveniently be done by first patterning the metal 151, and then using this metal pattern as a template for etching the semiconductor. The mesas may be etched into the upper mirror 151 and cavity layer 153. It may also extend into the lower mirror 139. Preferably the mesa may have a diameter so as to support a single transverse mode inside the cavity 137.

The optical fibre 29 or collection optic is placed on the substrate side 145 of the wafer. An area of the substrate may be etched away, so as to allow a more efficient coupling to an optical fibre and convenient mounting of the fibre. An etch stop layer may be included in the epitaxial growth, to allow the depth of the substrate etch to be carefully controlled. An anti-reflection coating may be deposited on the collection face to reduce the Fresnel losses.

In this example the bulk of the cavity 137 is made of GaAs, however, the cavity could also be formed from an AlGaAs layer. In this case the thickness of the cavity must be adjusted so as to maintain resonance of the cavity mode and the quantum dot, because of the difference in the AlGaAs and GaAs refractive indices.

The lower Bragg mirrors could be formed using alternating layers of dielectrics such as $SiO_2$ and $TiO_2$. For the lower mirror the substrate can be etched away before the lower Bragg mirror is deposited. An etch stop layer may be included in the growth structure to allow this.

The examples shown in FIGS. 22 to 28 will be described with electrons as the first type carriers and holes as the second type carriers. However, it will be appreciated by those skilled in the art that the inverse devices could be envisaged with holes as the first type carriers and electrons as the second type carriers.

Figure 22:
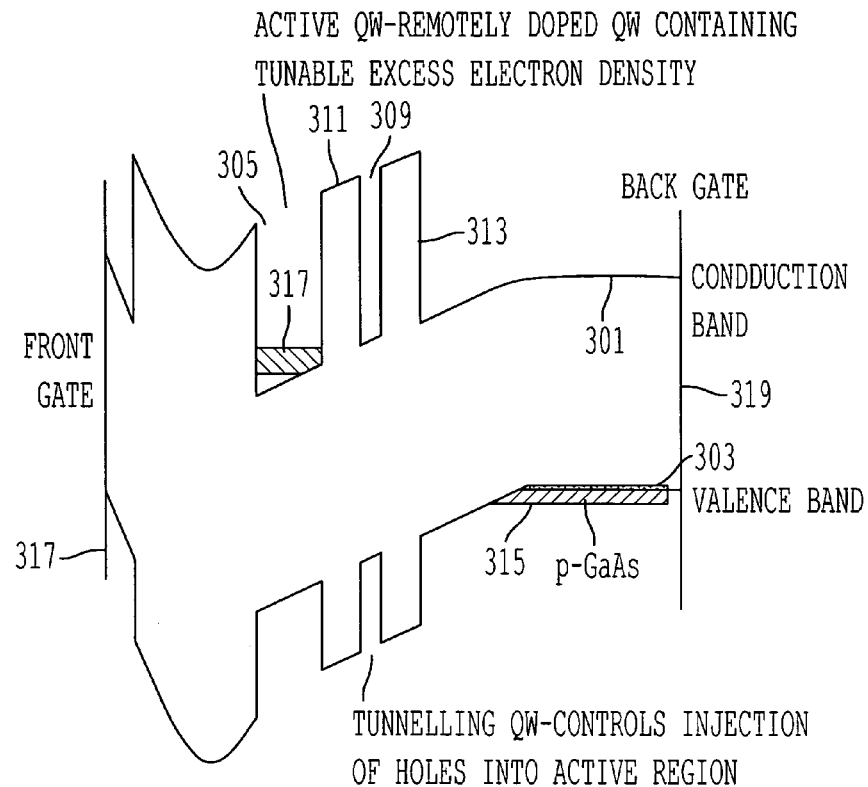
FIG. 22 shows a band structure of an optical source in accordance with an embodiment.

FIG. 22 shows a schematic band structure of a photon source in accordance with an embodiment of the present invention. A conduction band 301 and a valence band 303 are shown. The conduction band 3011 defines the rules for the conduction of electrons through the layers of the device and the valence band 303 defines the transport characteristics of the holes in the device.

The band structure of the device will initially be described with respect to the conduction band 301. In the conduction band 301, a quantum well is a minimal in the conduction band where electrons may be trapped. The device comprise an active layer 5 which is a quantum well layer. This layer 305 is capable of supporting a two dimensional electron gas 307. The active layer 305 is separated from tunnel layer 309 by a first barrier layer 311. Tunnel layer 309 is again a quantum well layer.

A plurality of confined energy levels may be formed in tunnel layer 309. However, tunnel layer 309 does not have excess carriers. First barrier layer 311 interposed between tunnel layer 309 and active layer 305 prevents tunnelling between tunnel layer 309 and active layer 305 unless a confined energy level of tunnel layer 309 and active layer 305 are aligned. The first barrier layer 311 has a larger band gap than both the active layer 305 and the tunnel layer 309. To confine the carrier states in tunnel layer 309, a second barrier layer 313 is provided. Second barrier layer 13 is disposed between tunnel layer 309 and a reservoir region of holes 315. Reservoir region of holes may be provided by a p-doped layer. The inverse structure is seen in the valence band 303. However, here, a quantum well for holes is defined by a maximum in the valence band. A front gate 317 which is a Schottky gate is provided on the side of the structure parallel to and closest to the active layer 305. A back gate 319 is provided on the opposing side of the structure.

Ohmic contacts (not shown) are provided to the active layer 305 such that the front 317 or back 319 gates may be biased with respect to the active layer 305.

Applying a bias via the front gate 317 to the active layer 305 serves to vary the carrier concentration of the 2DEG 7 within active layer 305. Applying a bias to the back gate 319 serves to vary the band structure as shown in FIG. 23.

Figure 23:
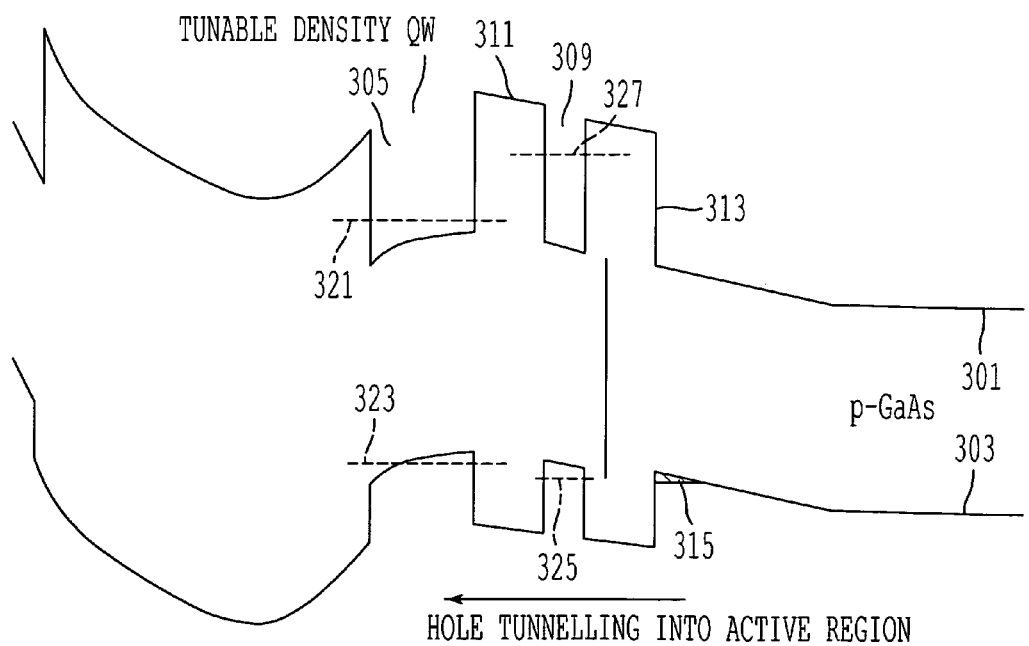
FIG. 23 shows a variation in the band structure of FIG. 22.

For clarity, where possible, the same reference numerals have been used in FIG. 23 as in FIG. 22. The front 317 and back 319 gates have been omitted from FIG. 23. In FIG. 2, a confined conduction band state 321 and a confined valence band state 323 are shown in the active layer 305. Further, a confined valence band state 325 and a confined conduction band state 327 are shown in the tunnel layer 309. Under the operating conditions shown in FIG. 2, tunnelling is inhibited and holes accumulate in the structure as shown in the figure in the region 315. Only suitable bias is applied so that the confined valence band state 323 with the first active layer 325 aligns with a confined valence band state 325 of the tunnel layer 309, holes tunnel into the tunnel layer 325 and then into the active layer 305. Electron tunnelling is not allowed as the confined electron level 27 of the tunnel layer 9 is not aligned with the confined conduction band level 321 of the active layer 305. Once the bias is changed so that valence band levels 23 and 25 do not align, tunnelling of holes is inhibited. Thus, tunnel layer 309 acts as a valve which can be switched on (valence band levels 323 and 325 align) to allow injection of holes into the active layer 305 or switched off (valence band levels 323 and 325 do not align).

The use of both the front gate and back gate allow the carrier concentration of the electrons in the active layer 305 to be maximised for a given alignment of valence bands. The increase carrier concentration in the active layer increases the chances of a hole radiatively recombining with an electron in the active layer 305. This enhances the possibility of photon emission.

Figure 24:
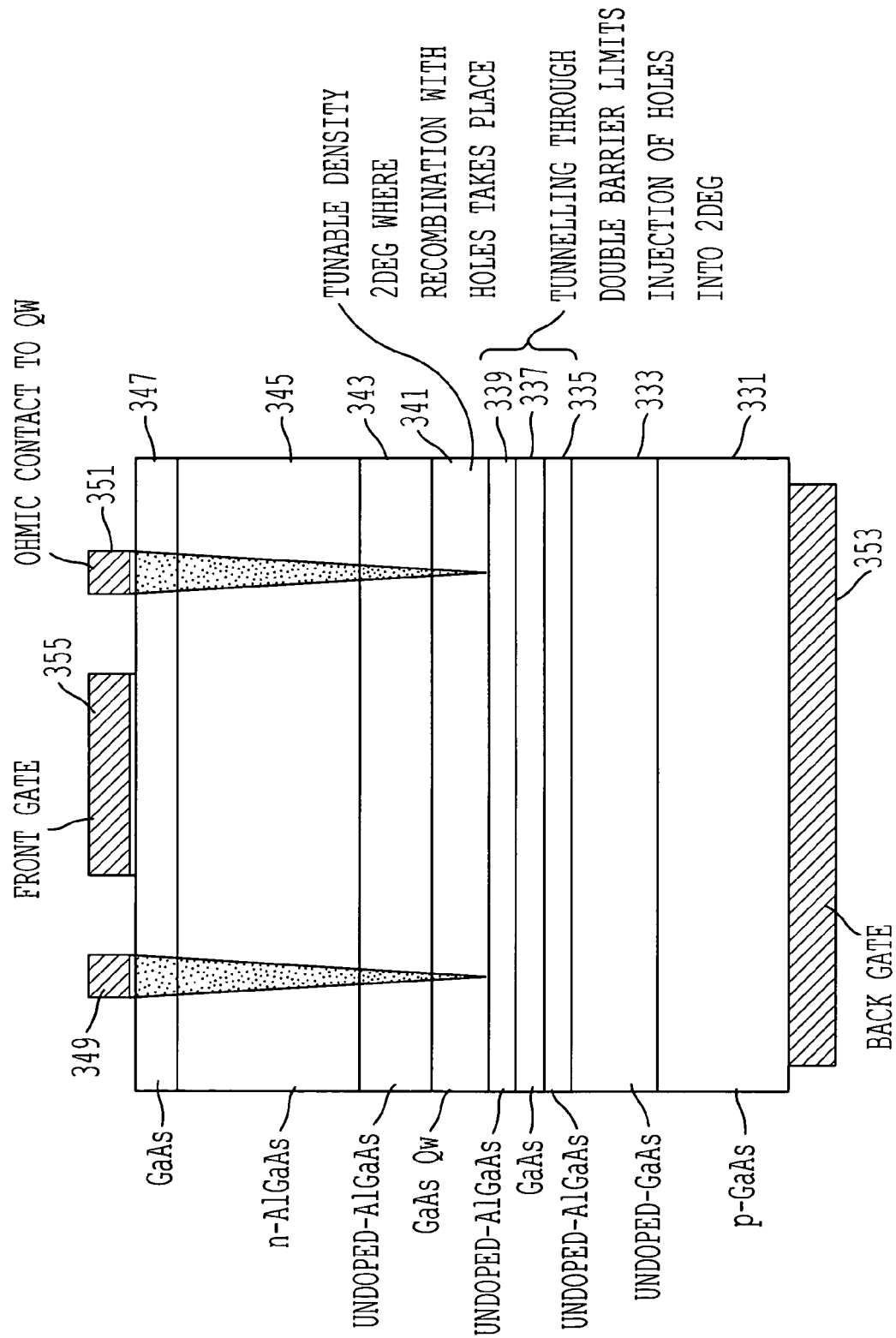
FIG. 24 shows a semiconductor device in accordance with a further embodiment of the present invention.

FIG. 24 shows a possible layer structure which can be used to create the schematic band structure of FIGS. 1 and 2.

A p-doped GaAs layer is formed on a substrate. The layer 331 is Be doped with a carrier concentration of $10^{18}$ cm$^{-3}$. The layer is grown to 200 nm. An 80 nm layer 333 is formed on an upper surface of the p-doped layer 331. The p-doped layer 331 will serve as a reservoir region for holes. A second tunnel barrier layer 335 is then formed overlying an upper surface of the undoped layer 333. The second barrier layer 335 is undoped AlGaAs. A tunnel layer 337 of 29 nm GaAs is then formed overlying the second barrier layer 335. A first barrier layer 339 of AlGaAs 10 nm is formed overlying an upper surface of the tunnel layer 337. An active layer 341 is then formed overlying an upper surface of the first barrier layer 339. The active layer is formed from 30 nm GaAs. A 60 nm undoped spacer layer of AlGaAs 343 is then formed overlying an upper surface of the active layer 341. A doped barrier layer 345 which serves to provide electrons to the active layer 341 is formed from 200 nm of Si doped ($10^{17}$ cm$^{-3}$) of AlGaAs. This is so-called remote doping of the active layer reduces impurity scattering and increases the mobility of the two dimensional carrier gas, resulting in a device of high quality. The semiconductor layers of the structure are finished with a GaSs cap layer of 17 nm 47 which is formed overlying an upper surface of the doped barrier layer 345. Ohmic contacts 349 and 351 are then formed to contact the active layer 341. The ohmic contacts are formed from AuGeNi. They are annealed so to defuse down into the active layer 341. A back gate of AuGeNi is formed on the lower surface of p-doped layer 331. A front gate of semi-transparent NiCr (8 nm) is formed overlying an upper surface of the GaAs cap layer 347.

Figure 25:
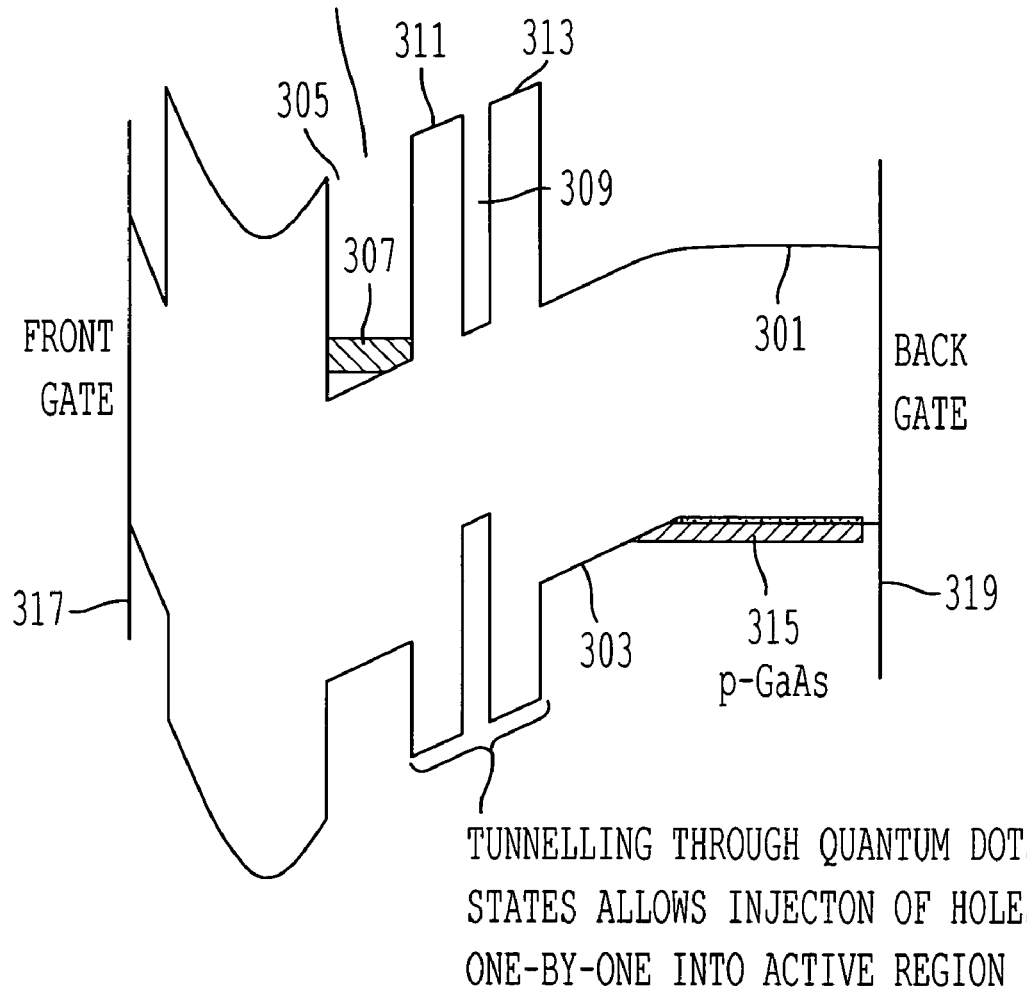
FIG. 25 shows a band structure of a single photon source in accordance with a further embodiment of the present invention.

FIG. 25 shows a variation on the band structure of FIG. 22. Where possible, the same reference numerals have been used. The structure is very similar to that described with reference to FIG. 1. However, the tunnel layer 309 is instead formed from a plurality of quantum dots. The operation of this device is described with reference to FIG. 26. For clarity, only a single quantum dot will be described. As this device is to be configured as a single photon source, it is important that only one hole is introduced into the active layer 305 at a time. Again, for clarity, the same reference numerals have been used where possible.

In FIG. 26A, a plurality of valence band levels 361 and 363 are formed in the dot tunnel layer 309. The back gate bias is varied so that the confined valence band level 361 aligns with that of the hole reservoir 315. Thus, a hole tunnels from the reservoir 315 into confined valence band levels 361. Only one hole can-tunnel at a time. This is because coulomb repulsion prevents the tunneling of a subsequent hole into the same dot. Also, as the energy level 361 is not aligned with valence band energy level 323, then a hole cannot tunnel from valence band level 361 into the active layer 305.

Figure 26B:
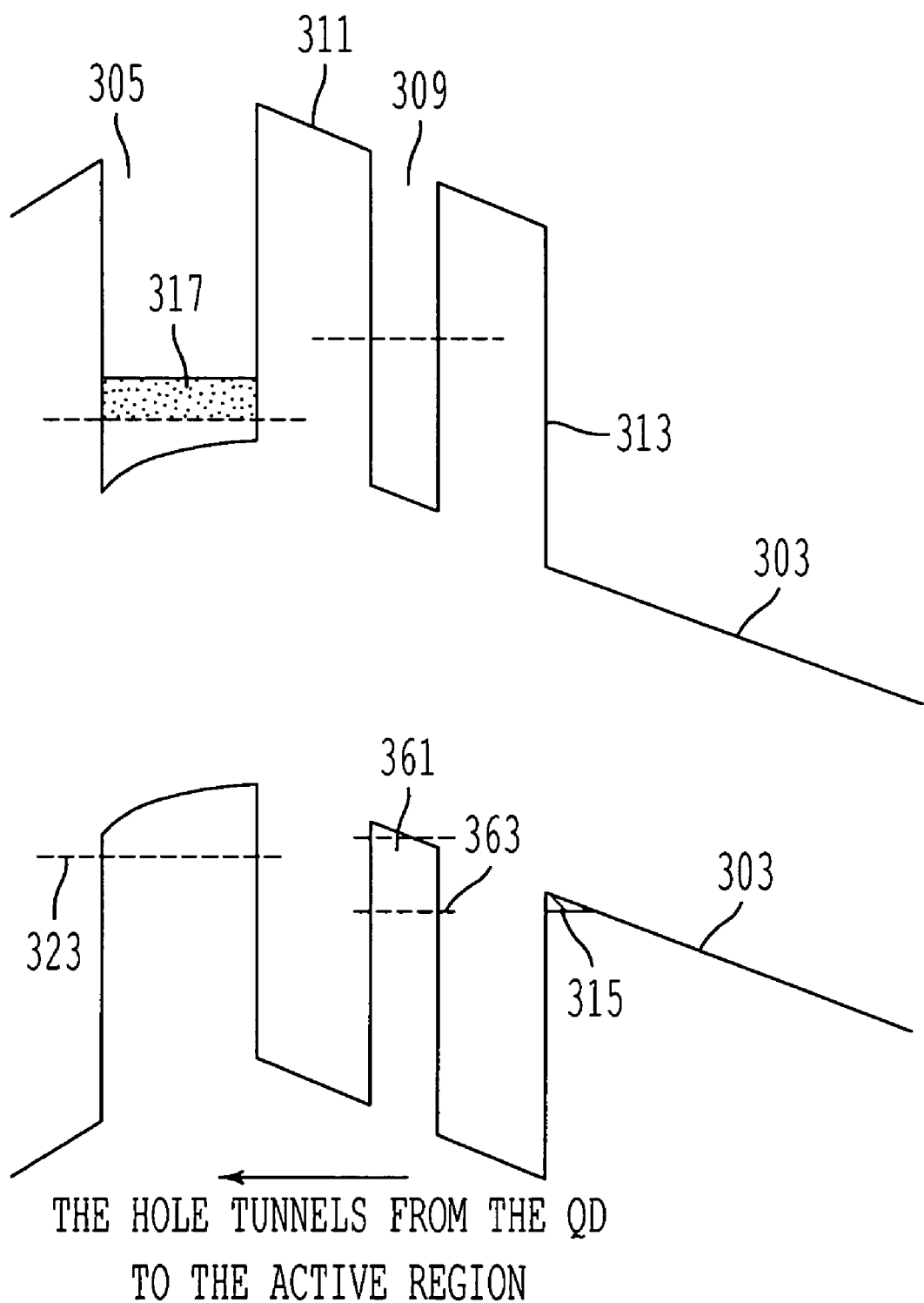
FIG. 26 shows a schematic band structure of a single photon source in accordance with a further embodiment of the present invention.

The bias is then further changed as shown in FIG. 26B so that valence band layer 323 aligns with valence band layer 361. Therefore, a hole can tunnel from the tunnel layer 309 into the active layer 305 and radiatively recombine to emit a photon.

Figure 27:
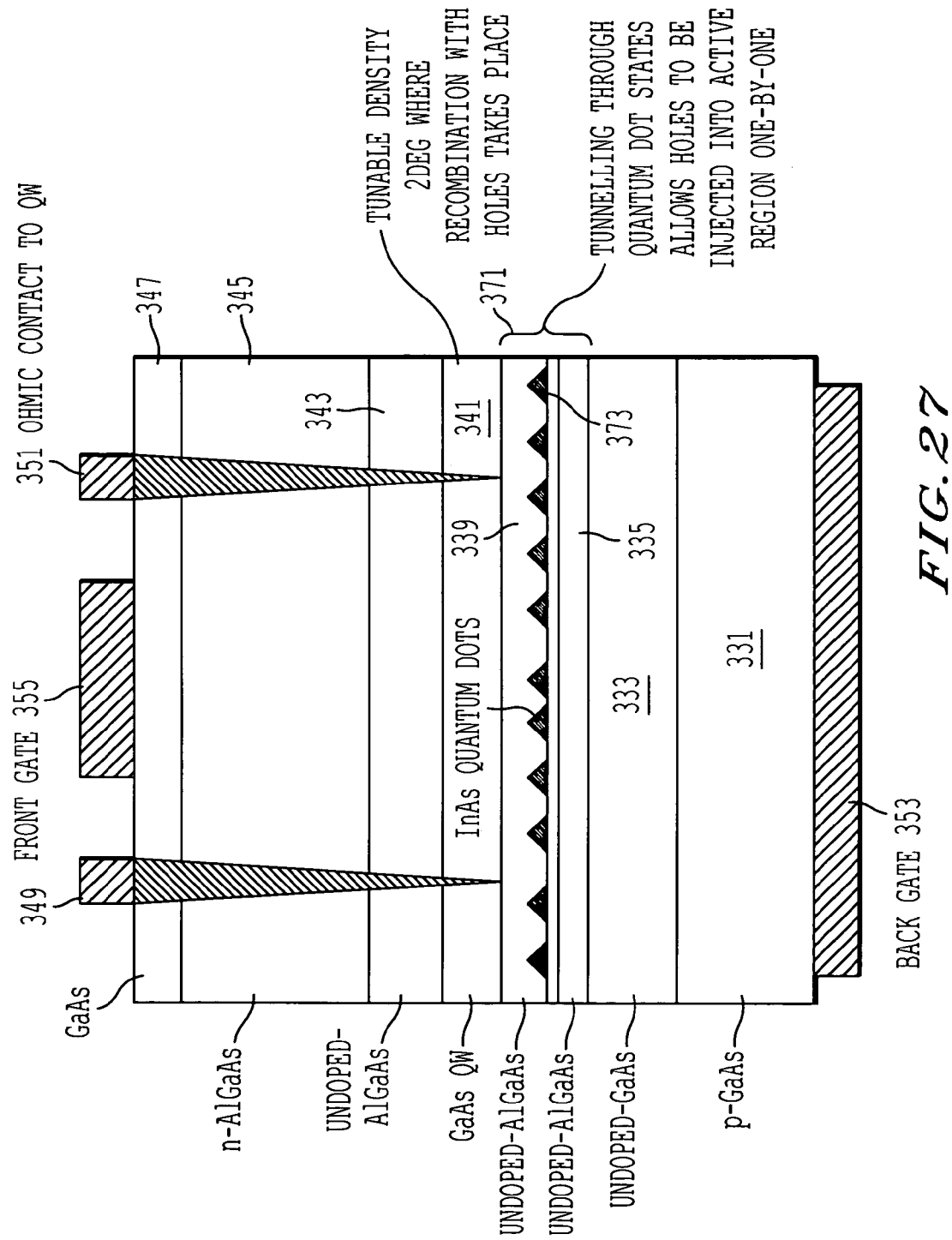
FIG. 27 shows a semiconductor device in accordance with a fourth embodiment of the present invention.

FIG. 27 shows a possible layer structure of the single photon device. Many of the layers are identical to those described in relation to FIG. 3. Therefore, to avoid repetition, the same numerals have been used where appropriate.

The region of the device known as the tunnelling region 371 differs from that shown in FIG. 3. As in FIG. 3, a first undoped AlGaAs tunnel layer is formed. This is layer 335. Two mono layers of InAs are then formed overlying an upper surface of the second tunnel layer. These layers formed quantum dots using the well known Stranskii-Krastanov process. A 10 nm layer of AlGaAs first barrier layer is then formed overlying the dot layer 373. The remainder of the process remains identical.

For a photon emitter, be it a single photon emitter or a more conventional multiple photon source, the efficiency is covered by the relative rates of radiative and non radiative recombination. Hence, the efficiency of the device is maximised by increasing the radiative recombination rate. For a single photon emitter, the time during which emission takes place must be as rapid as possible. This is also to minimise jitter, the uncertainty in the time of emission of a photon. Also, for a single photon emitter operating by the radiative recombination of a single charged carrier, the efficiency of the radiative process must be high. Both of these requirements call for as rapid a decay rate as possible.

Figure 28:
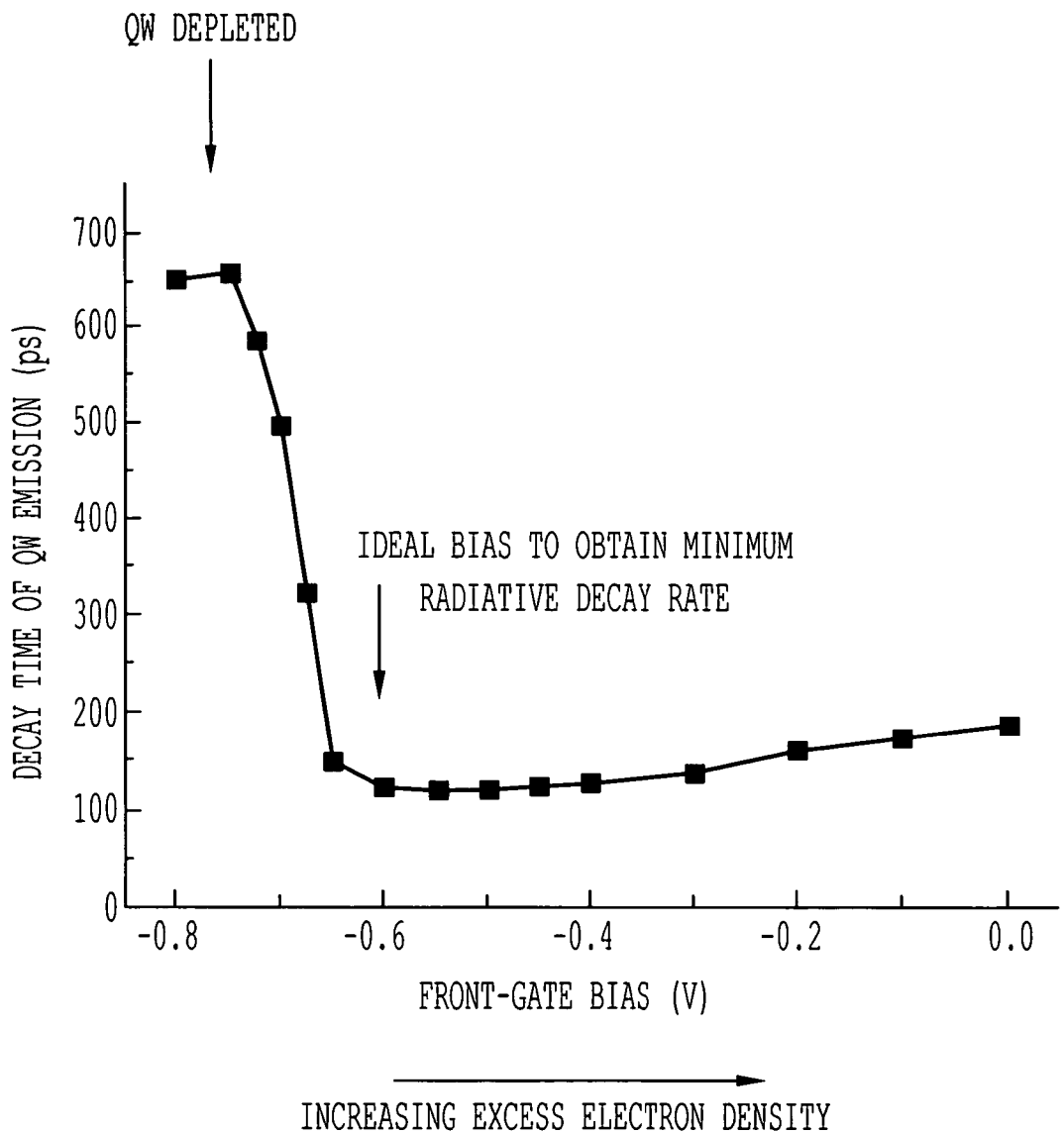
FIG. 28 shows a plot showing radiative recombination as a function of excess carrier concentration.
Figure 29:
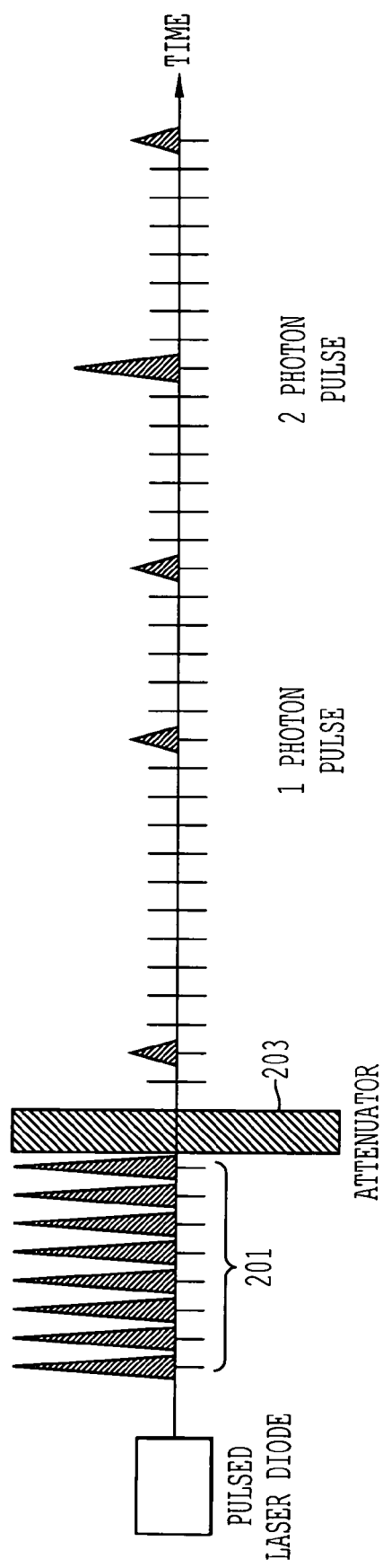
FIG. 29 shows a prior art emitter.

In order to verify this principle, FIG. 28 shows results of the radiative decay time of the quantum well emission as a fraction of front gate bias. The front gate bias can be equated to the excess carrier density. The bias is where the quantum well is depleted of electrons (about −0.8 volts), a decay time of 650 ps is observed. As a bias is made more positive, the decay time reduces dramatically to a minimum of 110 ps at −0.6 volts, it can be seen that as the excess electron density is increased further, the decay time rises. It is therefore advantageous to have an active region which has a tuneable excess electron density so as to be able to ensure a minimum in the radiative decay time.

What is claimed is:

1. A photon source configured to allow emission of a predetermined number of photons at predetermined times comprising:
    a quantum dot fully encapsulated between two layers, said quantum dot having a first confined energy level capable of being populated with a first carrier which is an electron and a second confined energy level capable of being populated by a second carrier which is a hole; and
    electrical supply means for supplying carriers to the energy levels, wherein the supply means are configured to electrically supply a predetermined number of carriers to at least one of the energy levels to allow recombination of carriers in said quantum dot to emit at least one photon.

2. The photon source of claim 1, wherein the supply means are configured to repetitively supply a predetermined number of carriers at a predetermined time to the at least one energy level to allow emission of a predetermined number of photons at predetermined time intervals.

3. The photon source of claim 1, wherein the supply means are configured to repetitively supply a single carrier to the at least one energy level to allow emission of a single photon separated from each other by predetermined time intervals.

4. The photon source of claim 1, comprising a plurality of quantum dots.

5. The photon source of claim 1, wherein the supply means comprises means to electrically inject a predetermined number of carriers into the other of said energy levels.

6. The photon source of claim 1, wherein the carriers are injected into the other of said energy levels at the energy of said other energy level.

7. The photon source of claim 1, wherein the source has an output surface through which the emitted photons are collected, the source further comprising coupling means for coupling the emitted photons to a fiber optic cable.

8. The photon source of claim 1, wherein the source has an output surface through which the emitted photons are collected and comprises an anti-reflection coating located on said output surface.

9. The photon source of claim 1, wherein the source further comprises a lens for collecting emitted photons.

10. The photon source of claim 1, wherein the source comprises a mirror cavity having a mirror located on opposing sides of said quantum dot.

11. The photon source of claim 10, wherein the source has an output surface through which the emitted photons are collected and said mirror closest to said output surface is partially reflective such that it can transmit the emitted photons.

12. The photon source of claim 10, wherein the energy of the cavity mode for said mirror cavity is substantially equal to that of the emitted photons.

13. The photon source of claim 10, wherein the distance between the two mirrors $L_{cav}$ bounding the cavity is defined by the equation:

$$L_{cav} = \frac{m\lambda}{2n_{cav}};$$

where $\lambda$ is the wavelength of the emitted photons, m is an integer and $n_{cav}$ is the refractive index of the cavity.

14. The photon source of claim 10, wherein the spectral band-pass of the cavity is substantially equal to the spectral width of the radiation emitted from the dot in the absence of a cavity.

15. The photon source of claim 10, wherein the quantum dot is positioned at an anti-node of the standing wave pattern caused by said mirrors.

16. The photon source of claim 10, wherein at least one of the mirrors is a Bragg mirror comprising a plurality of alternating layers wherein each layer satisfies the relation $$nt=\lambda/4$$

wherein $\lambda$ is the wavelength of the emitted photons, n and t are the refractive index and thickness respectively of a layer within the mirror.

17. The photon source of claim 10, wherein a mirror comprises a metal layer and a phase matching layer.

18. The photon source according to claim 1, wherein the source further comprises an optic fiber cable for collecting the emitted light.

19. The photon source according to claim 18, wherein a wavelength of the optic fiber cable is substantially equal to a wavelength of a cavity mode of the mirror cavity.

20. The photon source of claim 18, wherein the optical fiber has a non-reflective coating.

21. The photon source of claim 1, wherein the source further comprises a filter configured to select emitted photons of a particular energy.

22. The photon source of claim 1, wherein the source further comprises a polarizer configured to select emitted photons of a particular polarization.

23. The photon source of claim 1, wherein said quantum dot is encapsulated between two layers having different lattice constants than the quantum dot.

24. A photon source configured to allow emission of a predetermined number of photons at predetermined times comprising:
- a quantum dot having a first confined energy level capable of being populated with a first carrier which is an electron and a second confined energy level capable of being populated by a second carrier which is a hole; and
- supply means for supplying carriers to the energy levels, wherein the supply means comprises a source of pulsed incident radiation configured to resonantly excite a predetermined number of carriers into the first and second energy levels respectively to allow recombination of carriers in said quantum dot to emit at least one photon,
- wherein said quantum dot is encapsulated between two layers having different lattice constants than the quantum dot.

25. The photon source of claim 24, wherein the supply means comprises incident radiation configured to excite a predetermined number of electrons and/or holes into the first and second energy levels respectively.

26. The photon source of claim 24, wherein a pulse has a duration which is less than a relaxation time of a carrier which said pulsed radiation excites in the quantum dot.

27. The photon source of claim 24, wherein a time between leading edges of successive pulses is greater than a recombination time of an electron and a hole in the quantum dot.

28. The photon source of claim 26, wherein a time between leading edges of successive pulses is greater than a recombination time of an electron and a hole in the quantum dot.

29. A photon source configured to allow emission of a predetermined number of photons at predetermined times comprising:
- a quantum dot having a first confined energy level capable of being populated with a first carrier which is an electron and a second confined energy level capable of being populated by a second carrier which is a hole; and
- supply means comprising a source of continuous incident radiation for supplying carriers to the energy levels, and a modulating electrical bias unit configured to vary the transition energies of the quantum dot,
- wherein a predetermined number of carriers are resonantly excited into at least one of the energy levels when a transition energy of the quantum dot matches an energy of the incident radiation to allow recombination of carriers in said quantum dot to emit at least one photon, and
- wherein said quantum dot is encapsulated between two layers having different lattice constants than the quantum dot.

30. A photon source configured to allow emission of a predetermined number of photons at predetermined times comprising:
- a plurality of quantum dots having first confined energy levels capable of being populated with first carriers which are electrons and second confined energy levels capable of being populated by second carriers which are holes, the quantum dots having a distribution of transition energies such that a level of the first confined energy levels and/or the second confined energy levels differs among the quantum dots;
- supply means for supplying carriers to the energy levels, wherein the supply means supply carriers to at least one of the first and second confined energy levels to allow recombination of carriers in said quantum dots to emit at least one photon; and
- a filter configured to select photons of a particular energy emitted from just one quantum dot.

31. The photon source of claim 30, wherein said quantum dot is encapsulated between two layers having different lattice constants than the quantum dot.

32. A photon source configured to allow emission of a predetermined number of photons at predetermined times comprising:
- a plurality of quantum dots having first confined energy levels capable of being populated with first carriers which are electrons and second confined energy levels capable of being populated by second carriers which are holes, the quantum dots having a distribution of transition energies such that a level of the first confined energy levels and/or the second confined energy levels differs among the quantum dots; and
- supply means for resonantly supplying carriers to the energy levels, wherein the supply means selectively inject or excite carriers of a predetermined energy into one of the energy levels of just one quantum dot to allow recombination of a predetermined number of carriers in said quantum dot to emit at least one photon.

33. The photon source of claim 32, wherein said quantum dot is encapsulated between two layers having different lattice constants than the quantum dot.

* * * * *